(12) United States Patent
Onuki et al.

(10) Patent No.: US 9,704,562 B2
(45) Date of Patent: Jul. 11, 2017

(54) SEMICONDUCTOR DEVICE WITH STACKED STRUCTURE OF MEMORY CELLS OVER SENSING AMPLIFIERS, CIRCUIT BOARD, AND ELECTRONIC DEVICE

(71) Applicant: Semiconductor Energy Laboratory Co., Ltd., Atsugi-shi, Kanagawa-ken (JP)

(72) Inventors: Tatsuya Onuki, Kanagawa (JP); Kiyoshi Kato, Kanagawa (JP); Wataru Uesugi, Kanagawa (JP); Takahiko Ishizu, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/872,535

(22) Filed: Oct. 1, 2015

(65) Prior Publication Data

US 2016/0104521 A1 Apr. 14, 2016

(30) Foreign Application Priority Data

Oct. 10, 2014 (JP) .................................. 2014-208996
Nov. 7, 2014 (JP) .................................. 2014-227326
Jul. 28, 2015 (JP) .................................. 2015-148775

(51) Int. Cl.
*G11C 7/00* (2006.01)
*G11C 11/4091* (2006.01)
(Continued)

(52) U.S. Cl.
CPC ............ *G11C 11/4091* (2013.01); *G11C 7/02* (2013.01); *G11C 11/4094* (2013.01);
(Continued)

(58) Field of Classification Search
CPC ........... H01L 27/0207; H01L 27/11578; H01L 27/11551; G11C 2213/71; G11C 5/025
(Continued)

(56) References Cited

U.S. PATENT DOCUMENTS 5,353,255 A 10/1994 Komuro
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

International Search Report (Application No. PCT/IB2015/057436) Dated Jan. 12, 2016.
(Continued)

*Primary Examiner* — David Lam
(74) *Attorney, Agent, or Firm* — Fish & Richardson P.C.

(57) ABSTRACT

A semiconductor device with low power consumption or a semiconductor device with a reduced area is provided. The semiconductor device includes a cell array including a first memory cell and a second memory cell; and a sense amplifier circuit including a first sense amplifier and a second sense amplifier. The cell array is over the sense amplifier circuit. The first sense amplifier is electrically connected to the first memory cell through a first wiring BL. The second sense amplifier is electrically connected to the second memory cell through a second wiring BL. The first sense amplifier and the second sense amplifier are electrically connected to a wiring GBL. The sense amplifier circuit is configured to select one of a potential of the first wiring BL and a potential of the second wiring BL and output the selected potential to the wiring GBL.

22 Claims, 26 Drawing Sheets

(51) Int. Cl.
*G11C 7/02* (2006.01)
*G11C 11/4094* (2006.01)
*G11C 11/4097* (2006.01)
*H01L 27/108* (2006.01)
*G11C 5/02* (2006.01)

(52) U.S. Cl.
CPC .... *G11C 11/4097* (2013.01); *H01L 27/10808* (2013.01); *G11C 5/025* (2013.01); *G11C 2213/71* (2013.01)

(58) Field of Classification Search
USPC ................. 365/72, 205, 207, 51, 230.03
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,706,208 | B2* | 4/2010 | Takemura .............. G11C 5/025 365/230.03 |
| 7,732,819 | B2 | 6/2010 | Akimoto et al. |
| 8,455,868 | B2 | 6/2013 | Yamazaki et al. |
| 8,809,927 | B2 | 8/2014 | Takemura |
| 8,854,084 | B2 | 10/2014 | Shionoiri et al. |
| 8,885,437 | B2 | 11/2014 | Matsuzaki |
| 9,478,276 | B2 | 10/2016 | Onuki |
| 9,542,977 | B2 | 1/2017 | Onuki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2012/0127781 | A1 | 5/2012 | Saito |
| 2012/0230138 | A1 | 9/2012 | Endo |
| 2013/0070506 | A1* | 3/2013 | Kajigaya ................. G11C 7/18 365/51 |
| 2013/0100748 | A1 | 4/2013 | Takemura |
| 2013/0155790 | A1 | 6/2013 | Atsumi |
| 2013/0256657 | A1 | 10/2013 | Yamazaki et al. |
| 2014/0355339 | A1 | 12/2014 | Inoue et al. |
| 2015/0262642 | A1 | 9/2015 | Koyama |
| 2015/0325282 | A1 | 11/2015 | Kato et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-144253 A | 6/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-151383 A | 8/2011 |

(56) References Cited

FOREIGN PATENT DOCUMENTS

| JP | 2012-129512 A | 7/2012 |
|---|---|---|
| KR | 2014-0142208 A | 12/2014 |
| TW | 201234534 | 8/2012 |
| WO | WO-2004/114391 | 12/2004 |

OTHER PUBLICATIONS

Written Opinion (Application No. PCT/IB2015/057436) Dated Jan. 12, 2016.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kimizuka.N et al., "Spinel,YbFe2O4, and Yb2Fe3O7 Types of Structures for Compounds in the IN2O3 and Sc2O3—A2O3—BO Systems [A; Fe, Ga, or Al; B: Mg, Mn, Fe, Ni, Cu, or Zn] At Tempersatures Over 1000° C.", Journal of Solid State Chemistry. 1985, vol. 60, pp. 382-384.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film, Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World'S Largest (15-Inch) XGA AMLCD Panel Using IgZo Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IgZo Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film, and its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Tehcnical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

(56) References Cited

OTHER PUBLICATIONS

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review, B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film, Transistors by Ar Plasama Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposre to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B. (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation with Ultraviolet Lamp", Jounral of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

* cited by examiner

SEMICONDUCTOR DEVICE WITH STACKED STRUCTURE OF MEMORY CELLS OVER SENSING AMPLIFIERS, CIRCUIT BOARD, AND ELECTRONIC DEVICE

TECHNICAL FIELD

One embodiment of the present invention relates to a semiconductor device or a memory device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. One embodiment of the present invention relates to a semiconductor device, a display device, a light-emitting device, a power storage device, a memory device, a circuit board, an electronic device, a driving method thereof, or a manufacturing method thereof.

BACKGROUND ART

A dynamic random access memory (DRAM) stores data by supply of electric charge to a capacitor. Thus, the off-state current of a transistor for controlling the supply of electric charge to the capacitor is preferably small. This is because the smaller the off-state current of the transistor is, the longer the data holding period can be; thus, the frequency of refresh operations can be reduced. Patent Document 1 discloses a semiconductor device that can hold stored content for a long time by using a transistor including an oxide semiconductor film and having extremely small off-state current.

REFERENCE

Patent Document

[Patent Document 1] Japanese Published Patent Application No. 2011-151383

DISCLOSURE OF INVENTION

An object of one embodiment of the present invention is to provide a novel semiconductor device or a novel memory device. Another object of one embodiment of the present invention is to provide a semiconductor device or a memory device with low power consumption. Another object of one embodiment of the present invention is to provide a semiconductor device or a memory device with a reduced area.

One embodiment of the present invention does not necessarily achieve all the objects listed above and only needs to achieve at least one of the objects. The description of the above objects does not disturb the existence of other objects. Other objects will be apparent from and can be derived from the description of the specification, the drawings, the claims, and the like.

A semiconductor device of one embodiment of the present invention includes a cell array including a first memory cell and a second memory cell; and a sense amplifier circuit including a first sense amplifier and a second sense amplifier. The cell array is over the sense amplifier circuit. The first sense amplifier is electrically connected to the first memory cell through a first wiring. The second sense amplifier is electrically connected to the second memory cell through a second wiring. The first sense amplifier and the second sense amplifier are electrically connected to a third wiring. The sense amplifier circuit is configured to select one of a potential of the first wiring and a potential of the second wiring and output the selected potential to the third wiring.

In the above semiconductor device, the first sense amplifier may include a first switch circuit, and the second sense amplifier may include a second switch circuit. The first switch circuit is electrically connected to a fourth wiring. The second switch circuit is electrically connected to a fifth wiring. The first switch circuit, the second switch circuit, the fourth wiring, and the fifth wiring each include a region overlapping with the cell array.

In the above semiconductor device, each of the first memory cell and the second memory cell may include a transistor and a capacitor. One of a source and a drain of the transistor is electrically connected to the capacitor. The transistor includes an oxide semiconductor in a channel formation region.

In the above semiconductor device, the capacitor may be over the transistor, and the capacitor may include a region overlapping with the oxide semiconductor.

A circuit board of one embodiment of the present invention includes an electronic component including the above semiconductor device; and a printed circuit board.

An electronic device of one embodiment of the present invention includes the above semiconductor device or the above circuit board; and at least one of a display portion, a microphone, a speaker, and an operation key.

According to one embodiment of the present invention, a novel semiconductor device or a novel memory device can be provided. According to one embodiment of the present invention, a semiconductor device or a memory device with low power consumption can be provided. According to one embodiment of the present invention, a semiconductor device or a memory device with a reduced area can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BEST MODE FOR CARRYING OUT THE INVENTION

Figure 1:
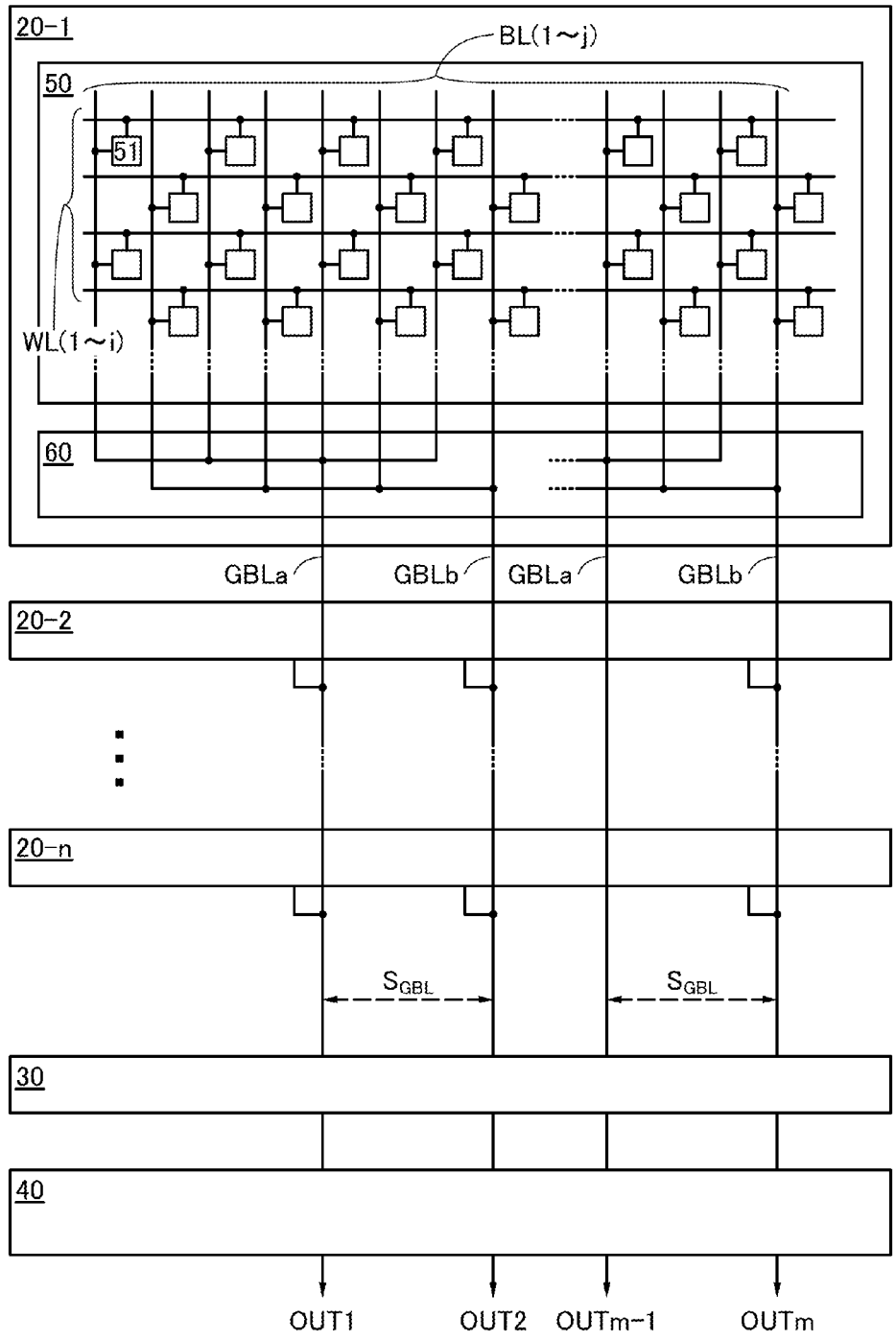
FIG. 1 illustrates a structure example of a semiconductor device.

Embodiments of the present invention will be described below in detail with reference to the drawings. Note that the present invention is not limited to the following description and it is easily understood by those skilled in the art that the mode and details can be variously changed without departing from the scope and spirit of the present invention. Therefore, the present invention should not be construed as being limited to the description in the following embodiments.

One embodiment of the present invention includes, in its category, devices such as a radio frequency (RF) tag, a semiconductor display device, and an integrated circuit. The display device includes, in its category, a display device including an integrated circuit, such as a liquid crystal display device, a light-emitting device in which a light-emitting element typified by an organic light-emitting element is provided in each pixel, an electronic paper, a digital micromirror device (DMD), a plasma display panel (PDP), and a field emission display (FED).

In describing structures of the present invention with reference to the drawings, the same reference numerals are used in common for the same portions in different drawings in some cases.

In this specification and the like, when it is explicitly described that X and Y are connected, the case where X and Y are electrically connected, the case where X and Y are functionally connected, and the case where X and Y are directly connected are included therein. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Even when independent components are electrically connected to each other in a diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a structure example of a semiconductor device of one embodiment of the present invention will be described.

<Structure Example of Semiconductor Device>

FIG. 1 illustrates a structure example of a semiconductor device 10. The semiconductor device 10 includes memory circuits 20, a main amplifier 30, and an input/output circuit 40. Here, a structure in which the semiconductor device 10 includes n (n is a natural number of 2 or more) memory circuits 20 (memory circuits 20-1 to 20-n) is shown.

Each of the memory circuits 20 includes a cell array 50 and a sense amplifier circuit 60. The cell array 50 includes a plurality of memory cells 51. Each of the memory cells 51 is connected to a wiring WL and a wiring BL. The memory cells 51 are selected according to a potential supplied to the wiring WL, and a potential corresponding to data to be written to the memory cells 51 is supplied to the wiring BL (hereinafter, the potential is also referred to as writing potential); in this manner, data is written to the memory cells 51. Here, the case where the cell array 50 includes the memory cells 51 arranged in a matrix of i rows and j columns (i and j are natural numbers) is shown. Therefore, in the cell array 50, i wirings WL and j wirings BL are provided. Note that here, the case where the memory circuit 20-1 includes the cell array 50 and the sense amplifier circuit 60 is shown; the memory circuits 20-2 to 20-n can have the same configuration as the memory circuit 20-1.

The sense amplifier circuit 60 is connected to the plurality of wirings BL and a plurality of wirings GBL. The sense amplifier circuit 60 has a function of amplifying a signal that is input and controlling output of the amplified signal. Specifically, the sense amplifier circuit 60 has a function of amplifying the potentials of the wirings BL (hereinafter, the potentials are also referred to as reading potentials), which correspond to data stored in the memory cells 51, and outputting them to the wirings GBL at a predetermined timing. Since the reading potentials are amplified by the sense amplifier circuit 60, data can be surely read even in the case where a potential read from the memory cell 51 is extremely low. Furthermore, since output of the amplified potentials to the wirings GBL is controlled, each of the wirings GBL can be shared.

In the example of FIG. 1, the sense amplifier circuit 60 has a function of amplifying the potentials of four wirings BL in odd-numbered columns and then selecting the amplified potential of one of the four wirings BL and outputting it to a wiring GBLa. Furthermore, the sense amplifier circuit 60 has a function of amplifying the potentials of four wirings BL in even-numbered columns and then selecting the amplified potential of one of the four wirings BL and outputting it to a wiring GBLb. Note that the number of the wirings BL connected to one wiring GBL is not limited to four, and may be a given number of 2 or more. In the example of FIG. 1, m (m is a natural number less than j) wirings GBL are provided. The wirings GBL are each connected to the memory circuits 20-2 to 20-n.

The main amplifier 30 is connected to the memory circuits 20 and the input/output circuit 40. The main amplifier 30 has a function of amplifying a signal that is input. Specifically, the main amplifier 30 has a function of amplifying the potentials of the wirings GBL and outputting them to the input/output circuit 40. Note that the main amplifier 30 is not necessarily provided.

The input/output circuit 40 has a function of outputting the potentials of the wirings GBL or the potentials read from the main amplifier 30 as reading data to the outside. In the example of FIG. 1, m-bit signals input from the m wirings GBL are output from the input/output circuit 40.

In the case where the wirings BL are connected to the respective wirings GBL, the number of the wirings GBL needs to be the same as the number of the wirings BL (here, j), and each of the j wirings GBL is connected to the main amplifier 30. At this time, the main amplifier 30 needs to amplify each of signals supplied to the j wirings GBL, and the power consumption for driving the main amplifier 30 and the j wirings GBL is increased in some cases. Furthermore, a distance SGBL between the wirings GBL is shortened, which reduces the layout flexibility of wirings provided over the wirings GBL; for such a reason, the parasitic capacitance generated between the wirings GBL is increased in some cases. In order to prevent that, the wirings GBL need to be supplied with signals in consideration of attenuation or delay of signals due to the parasitic capacitance; for example, the amplification factor in the sense amplifier circuit 60 is increased. As a result, power consumption for reading and writing data is increased.

On the other hand, in one embodiment of the present invention, the wiring GBL is shared by the plurality of wirings BL; the sense amplifier circuit 60 has a function of selecting some of the plurality of wiring BL and outputting the potentials of the selected wirings BL to the wirings GBL. For this reason, the number of the wirings GBL connected to the main amplifier 30 can be reduced, and thus the number of signals to be amplified in the main amplifier 30 can be reduced. As a result, the power consumption of the main amplifier 30 can be reduced. Furthermore, the number of the wirings GBL can be reduced, the distance $S_{GBL}$ between the wirings GBL can be lengthened, and the layout flexibility of the wirings provided over the wirings GBL can be improved; thus, the parasitic capacitance generated between the wirings GBL can be reduced and attenuation of signals supplied to the wirings GBL can be reduced. Consequently, a load on the sense amplifier circuit 60 and the main amplifier 30 due to the amplification of signals can be reduced, and thus the power consumption of the semiconductor device 10 can be reduced.

By reducing the number of the wirings GBL for a reduction in parasitic capacitance, the signals of the wirings GBL can be directly output to the input/output circuit 40 without being amplified. In this case, the main amplifier 30 can be omitted, and thus the power consumption and the area of the semiconductor device 10 can be reduced.

In one embodiment of the present invention, the sense amplifier circuit 60 can select signals to be output from the input/output circuit 40 to the outside from among the signals output from the wirings BL. For example, in FIG. 1, the sense amplifier circuit 60 can select m-bit data from among j-bit data stored in the cell array 50. Therefore, the input/output circuit 40 does not need to select some of the plurality of signals with the use of a multiplexer or the like. Accordingly, the configuration of the input/output circuit 40 can be simplified, and the area thereof can be reduced.

Note that the number of the wirings GBL is not particularly limited, and may be a given number smaller than the number of the wirings BL. For example, in the case where the number of the wirings BL connected to one wiring GBL is k (k is an integer of 2 or more), the number of the wirings GBL is j/k.

Note that here, the structure in which data stored in the memory cell 51 is output to the outside through the input/output circuit 40 is shown; the operation of writing data to the memory cell 51 can be performed on the basis of the same principle. Specifically, writing data that is input from the outside is output to the main amplifier 30 through the input/output circuit 40, and potentials amplified by the main amplifier 30 are input to the sense amplifier circuit 60. Then, potentials amplified by the sense amplifier circuit 60 are supplied to the wirings BL as writing potentials. Note that the timing of outputting the wiring potentials to the wirings BL can be controlled by the sense amplifier circuit 60. Therefore, an effect similar to that of the above operation of data reading can be obtained in the operation of data writing.

<Configuration Example of Memory Circuit>

Figure 2A:
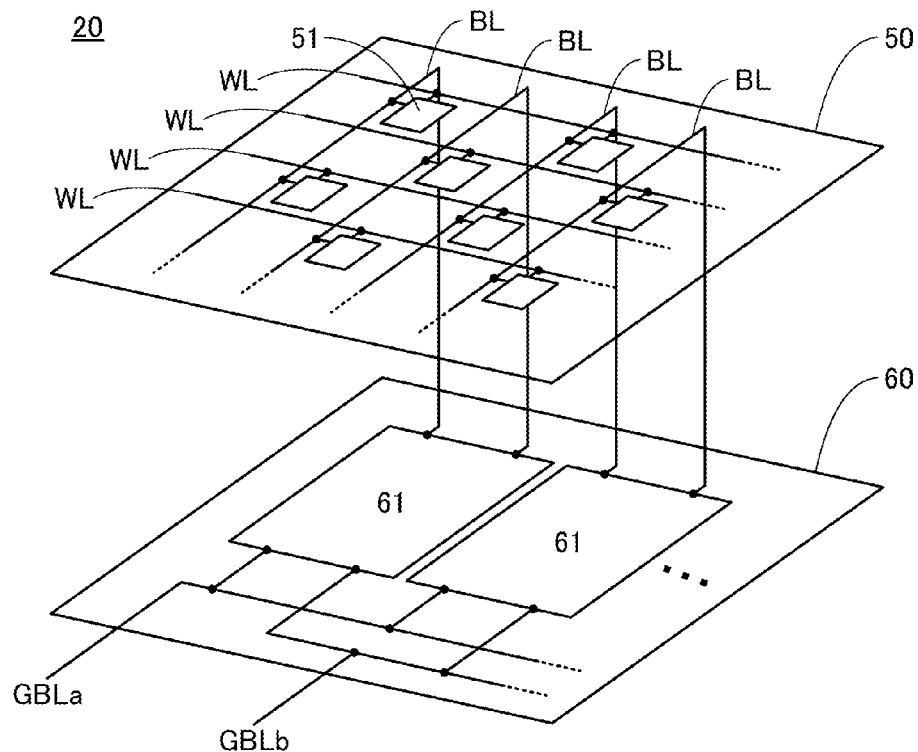
FIGS. 2A to 2C illustrate a configuration example of a memory circuit.
Figure 2B:
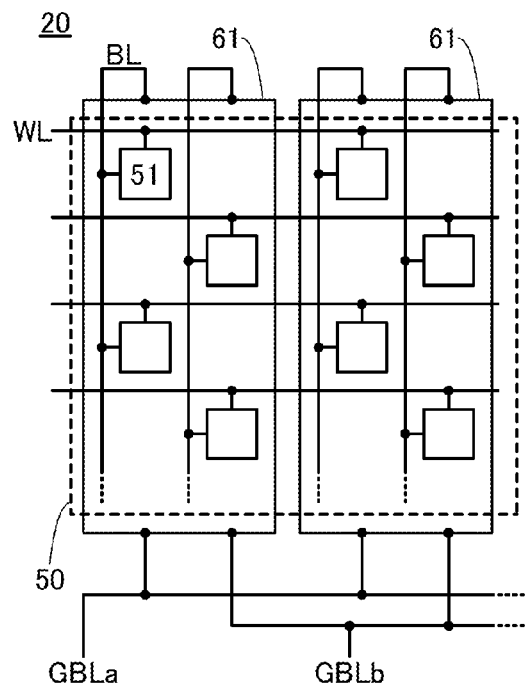

FIG. 2A illustrates a configuration example of the memory circuit 20. The memory circuit 20 includes the plurality of memory cells 51 provided in the cell array 50 and a plurality of sense amplifiers 61 provided in the sense amplifier circuit 60. FIG. 2B is a top view of the memory circuit 20 in FIG. 2A.

In one embodiment of the present invention, as a layout type of the cell array 50, a folded-type layout, an open-type layout, or the like can be used. In the case of a folded-type layout, noise generated in a reading potential which is output to the wiring BL can be reduced owing to a change in the potential of the wiring WL. On the other hand, in the case of an open-type layout, the density of the memory cells 51 can be higher than that in the case of a folded-type layout, and thus the area of the cell array 50 can be reduced. FIGS. 2A and 2B illustrate a structure example of the cell array 50 in the case of a folded-type layout. In the cell array 50 illustrated in FIGS. 2A and 2B, the memory cell 51 connected to one wiring BL and the memory cell 51 connected to a wiring BL adjacent to the one wiring BL are not connected to the same wiring WL.

The sense amplifier 61 has a function of amplifying a difference between a reference potential and a reading potential that is supplied to the wiring BL and holding the amplified potential difference. Furthermore, the sense amplifier 61 has a function of controlling the output of the amplified potential to the wiring GBL. Here, the sense amplifier 61 is connected to two wirings BL. The sense amplifier 61 is also connected to the wiring GBLa and the wiring GBLb.

In one embodiment of the present invention, the sense amplifiers 61 are positioned in a first layer, and the memory cells 51 are positioned in a second layer over the first layer. That is, in the memory circuit 20, the memory cells 51 are stacked over the sense amplifiers 61. At least one memory cell 51 is positioned so as to overlap with the sense amplifier 61. Accordingly, the area of the memory circuit 20 can be smaller than that in the case where the memory cells 51 and the sense amplifier 61 are positioned in the same layer. Consequently, the storage capacity per unit area of the memory circuit 20 can be increased. When all the memory cells 51 are positioned so as to overlap with the sense amplifier 61, the area of the memory circuit 20 can be further reduced. The memory cells 51 may be positioned so as to overlap with one sense amplifier 61; alternatively, the memory cells 51 may be positioned so as to overlap with the plurality of sense amplifiers 61. Note that there is no particular limitation on the number of the memory cells 51 in the cell array 50. For example, the number thereof can be 512 or smaller.

In order to reduce the power consumption of the memory circuit 20, the number of the memory cells 51 in the cell array 50 is preferably small. However, when the number of the memory cells 51 in the cell array 50 is reduced, the number of the memory circuits 20 needs to be increased in order to keep storage capacity; as a result, the number of the sense amplifiers 61 needs to be increased. Here, in the case where the memory cells 51 and the sense amplifiers 61 are provided in the same layer, an increase in the number of the sense amplifiers 61 directly leads to an increase in the area of the semiconductor device 10. Therefore, it is difficult to reduce the number of the memory cells 51 to a predetermined number or less.

On the other hand, in one embodiment of the present invention, a stacked structure of the memory cells 51 and the sense amplifiers 61 is employed; thus, even in the case where the number of the sense amplifiers 61 is increased with an increase in the number of the memory circuits 20, an increase in the area of the semiconductor device 10 can be minimized Therefore, the power consumption of the memory circuit 20 can be easily reduced by reducing the number of the memory cells 51 in the cell array 50. Specifically, the number of the memory cells 51 in the cell array 50 can be 64 or less, preferably 32 or less, more preferably 16 or less, still more preferably 8 or less. Note that the total area of the sense amplifiers 61 is preferably smaller than or equal to the area of the cell array 50; however, even in the case where the total area of the sense amplifiers 61 is larger than or equal to the area of the cell array 50, an increase in the area of the semiconductor device 10 can be reduced.

With the above stacked structure of the memory cells 51 and the sense amplifiers 61, the lengths of the wirings BL can be shortened. Consequently, the wiring resistance of the wirings BL can be low, and a reduction in the power consumption and an increase in the operation speed of the memory circuit 20 can be achieved. Furthermore, since the capacitances of capacitors provided in the memory cells 51 can be reduced, the areas of the capacitors can be small; thus the sizes of the memory cells 51 can be small. For example, the capacitance of a capacitor 53 to be described later can be 3.9 fF or less, the writing time and the reading time of the memory cell 51 can be 10 ns or less, 5 ns or less, or 3 ns or less, and the energy required for writing data can be 2 fJ or less.

Figure 2C:
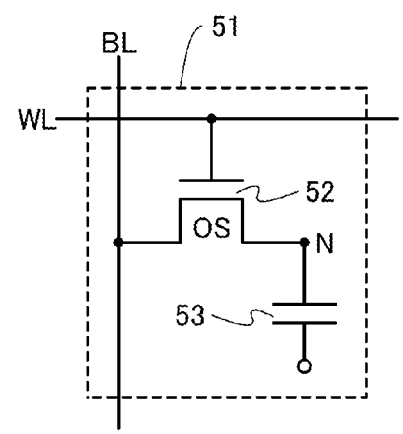

FIG. 2C illustrates a configuration example of the memory cell 51. The memory cell 51 includes a transistor 52 and the capacitor 53. A gate of the transistor 52 is connected to the wiring WL, one of a source and a drain thereof is connected to one electrode of the capacitor 53, and the other of the source and the drain thereof is connected to the wiring BL. The other electrode of the capacitor 53 is connected to a wiring or a terminal to which a predetermined potential (such as a ground potential) is supplied. Here, a node at which the one of the source and the drain of the transistor 52 and the one electrode of the capacitor 53 are connected to each other is referred to as a node N.

Here, the transistor 52 has a function of holding charge accumulated in the node N by being turned off. For that reason, the off-state current of the transistor 52 is preferably small. When the off-state current of the transistor 52 is small, leakage of charge held in the node N through the transistor 52 can be reduced. Consequently, data stored in the memory cell 51 can be held for a long time.

A transistor in which a channel formation region includes a semiconductor with a wider band gap and lower intrinsic carrier density than silicon or the like can have extremely small off-state current and thus is preferably used as the transistor 52. Examples of such a semiconductor material include an oxide semiconductor having a band gap greater than or equal to twice the band gap of silicon. A transistor in which a channel formation region includes an oxide semiconductor (hereinafter also referred to as an OS transistor) has much smaller off-state current than a transistor including a material other than an oxide semiconductor, such as silicon. Therefore, with the use of an OS transistor as the transistor 52, data written in the memory cell 51 can be held for an extremely long time and the interval between refresh operations can be long. Specifically, the interval between refresh operations can be an hour or longer. The transistor marked with a symbol "OS" in the drawing is an OS transistor. The details of an OS transistor will be described below in Embodiment 5 and the like.

With the use of an OS transistor for the memory cell 51, the memory circuit 20 can be used as a memory circuit in which data can be held for a long time. Therefore, power supply for the memory circuits in which data is not written or read among the memory circuits 20-1 to 20-n in FIG. 1 can be stopped for a long time. As a result, the power consumption of the semiconductor device 10 can be reduced.

Figure 21A:
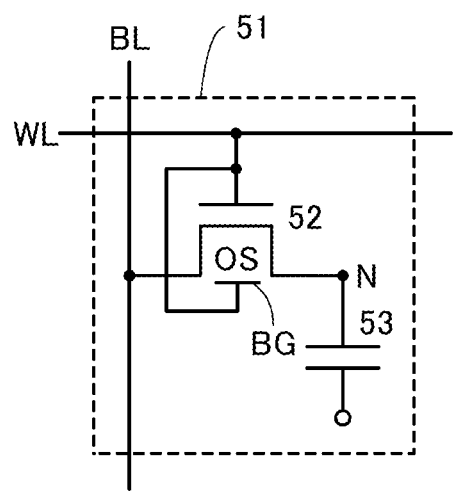
FIGS. 21A and 21B each illustrate a structure example of a memory cell.

Note that a backgate can be provided in the transistor 52. For example, as illustrated in FIG. 21A, a structure in which the transistor 52 includes a backgate BG connected to the gate of the transistor 52 can be employed.

Figure 21B:
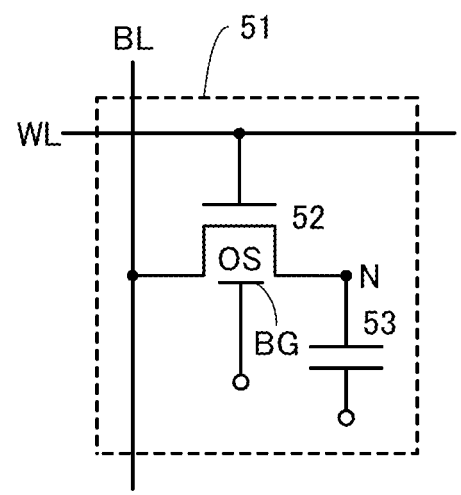

Note that the backgate BG may be connected to a wiring or a terminal to which a predetermined potential is supplied. For example, as illustrated in FIG. 21B, the backgate BG may be connected to a wiring to which a constant potential is supplied. The constant potential can be a high power supply potential or a low power supply potential such as a ground potential.

<Specific Example of Memory Circuit>

Next, a more specific configuration example of the memory circuit 20 will be described with reference to FIG. 3.

Figure 3:
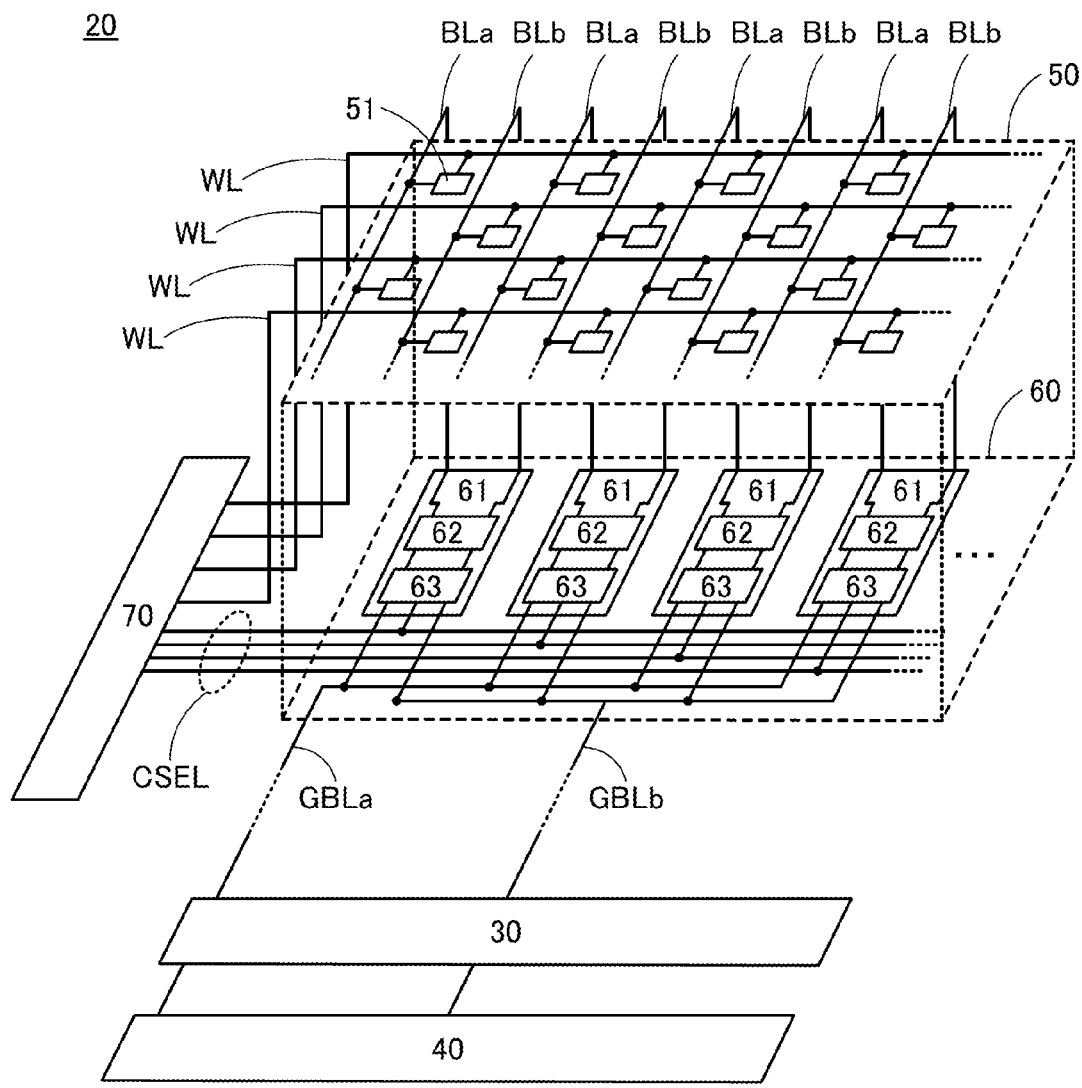
FIG. 3 illustrates a configuration example of a memory circuit.

The memory circuit 20 illustrated in FIG. 3 includes the cell array 50 including the plurality of memory cells 51 and the sense amplifier circuit 60 including the plurality of sense amplifiers 61. Note that the memory circuit 20 illustrated in FIG. 3 is the same as the memory circuit 20 illustrated in FIG. 1 and FIGS. 2A to 2C except for structures described below.

The wirings WL are connected to a driver circuit 70. The driver circuit 70 has a function of supplying a signal for selecting the memory cells 51 in which data is written (hereinafter, the signal is also referred to as a write word signal) to the wiring WL. Note that the driver circuit 70 can be formed using a decoder or the like.

The sense amplifiers 61 are connected to the memory cells 51 through the wirings BL. Here, a structure in which two adjacent wirings BL (a wiring BLa and a wiring BLb) are connected to the same sense amplifier 61 is shown. The sense amplifier 61 includes an amplifier circuit 62 and a switch circuit 63.

The amplifier circuit 62 has a function of amplifying the potential of the wiring BL. Specifically, the amplifier circuit 62 has a function of amplifying a difference between the potential of the wiring BL and a reference potential and holding the amplified potential difference. For example, in the case where the potential of the wiring BLa is amplified, a difference between the potential of the wiring BLa and the potential of the wiring BLb (i.e., a reference potential) is amplified. In the case where the potential of the wiring BLb is amplified, a difference between the potential of the wiring BLa (i.e., a reference potential) and the potential of the wiring BLb is amplified.

The switch circuit 63 has a function of determining whether the amplified potential of the wiring BL is output to the wiring GBL. Specifically, the switch circuit 63 has a function of controlling electrical connection between the wiring BLa and the wiring GBLa and electrical connection between the wiring BLb and the wiring GBLb.

The switch circuit 63 is connected to one of a plurality of wirings CSEL, and the operation of the switch circuit 63 is controlled on the basis of a signal supplied to the wiring CSEL from the driver circuit 70. Specifically, electrical connection between the wiring BLa and the wiring GBLa and electrical connection between the wiring BLb and the wiring GBLb are controlled. Accordingly, the wiring BL through which a potential is supplied to the wiring GBL can be selected from among the plurality of wirings BL, and the wiring GBL can be shared. As a result, the number of the wirings GBL can be reduced.

Here, in the above configuration, with the use of the switch circuits 63 and the wirings CSEL, signals to be output from the input/output circuit 40 (illustrated in FIG. 1) to the outside can be selected from among signals output from the wirings BL. Specifically, with the use of the switch circuits 63 and the wirings CSEL, m-bit data can be selected from among j-bit data stored in the cell array 50. Therefore, the input/output circuit 40 does not need to select some of the plurality of signals with the use of a multiplexer or the like. Accordingly, the configuration of the input/output circuit 40 can be simplified, and the area thereof can be reduced.

In the above structure, the switch circuits 63 and the wirings CSEL are preferably positioned so as to overlap with the cell array 50 as illustrated in FIG. 3. Specifically, the switch circuits 63 and the wirings CSEL are preferably positioned so as to overlap with the memory cells 51. Accordingly, an increase in the area of the memory circuit 20 can be reduced, and the sense amplifier circuit 60 can have a function of selecting an output signal.

Note the here, the wirings WL and the wirings CSEL are connected to the driver circuit 70; however, the wirings WL and the wirings CSEL may be connected to different driver circuits. In this case, the potentials of the wirings WL and the wirings CSEL are controlled by different driver circuits.

Next, examples of positions of the sense amplifiers 61 and the wirings CSEL in the sense amplifier circuit 60 will be described.

Figure 4A:
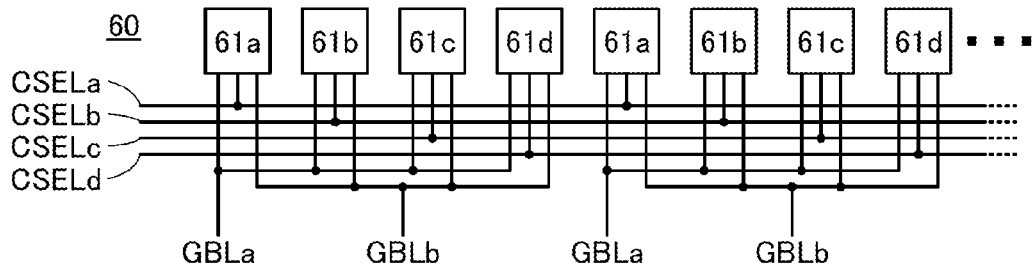
FIGS. 4A to 4D each illustrate a configuration example of a sense amplifier circuit.

In the example of FIG. 4A, four sense amplifiers 61 (sense amplifiers 61a to 61d) are arranged in a straight line periodically and each of the sense amplifiers 61 is connected to one of four wirings CSEL (wirings CSELa to CSELd). Specifically, the sense amplifier 61a is connected to the wiring CSELa, the sense amplifier 61b is connected to the wiring CSELb, the sense amplifier 61c is connected to the wiring CSELc, and the sense amplifier 61d is connected to the wiring CSELd. Each of the sense amplifiers 61 is connected to the wiring GBLa and the wiring GBLb.

Figure 4B:
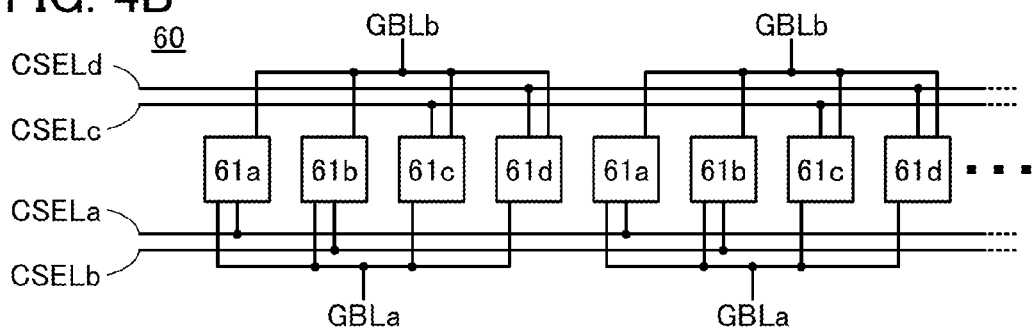

The sense amplifiers 61 may be provided between the plurality of wirings CSEL. For example, as illustrated in FIG. 4B, between the wirings CSELa and CSELb and the wirings CSELc and CSELd, the sense amplifiers 61 can be provided.

Figure 4C:
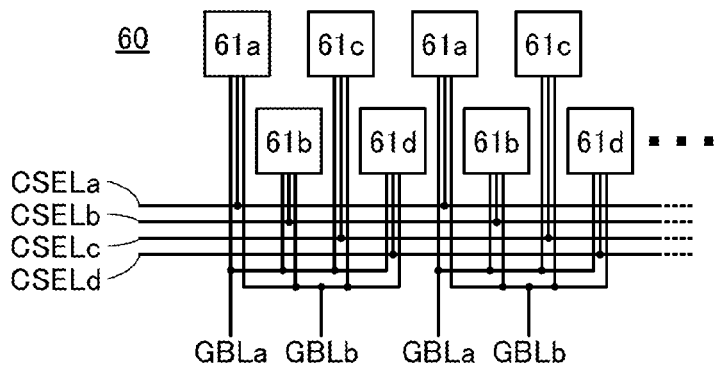

Alternatively, as illustrated in FIG. 4C, the sense amplifiers 61 may be arranged in a zigzag line. In this case, the sense amplifiers 61 may be arranged in such a manner that the sense amplifier 61b partially overlaps with the sense amplifiers 61a and 61c in the vertical direction in the drawing. That is, the extended lines of both end portions of the sense amplifier 61b can be on the inner side than the extended lines of both end portions of the sense amplifier 61a and on the inner side than the extended lines of both end portions of the sense amplifier 61c, respectively. In this case, the length of the sense amplifier circuit 60 in the width direction (the horizontal direction in the drawing) can be shorter than that in the case of FIG. 4A and FIG. 4B.

Figure 4D:
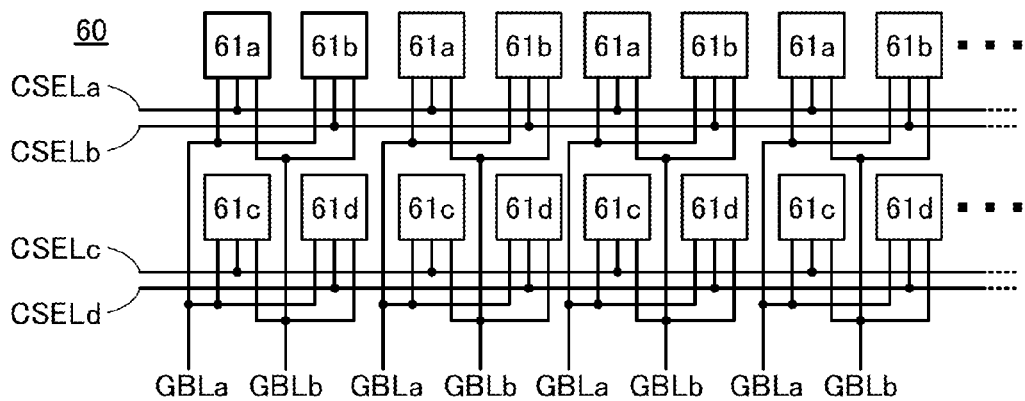

The sense amplifiers 61 may be provided in a plurality of lines. For example, as illustrated in FIG. 4D, the sense amplifiers 61 can be provided in two lines. Here, the sense amplifiers 61a to 61d provided in two rows and two columns are arranged periodically.

<Configuration Example of Sense Amplifier>

Next, a specific configuration example of the sense amplifier 61 of one embodiment of the present invention will be described.

Figure 5:
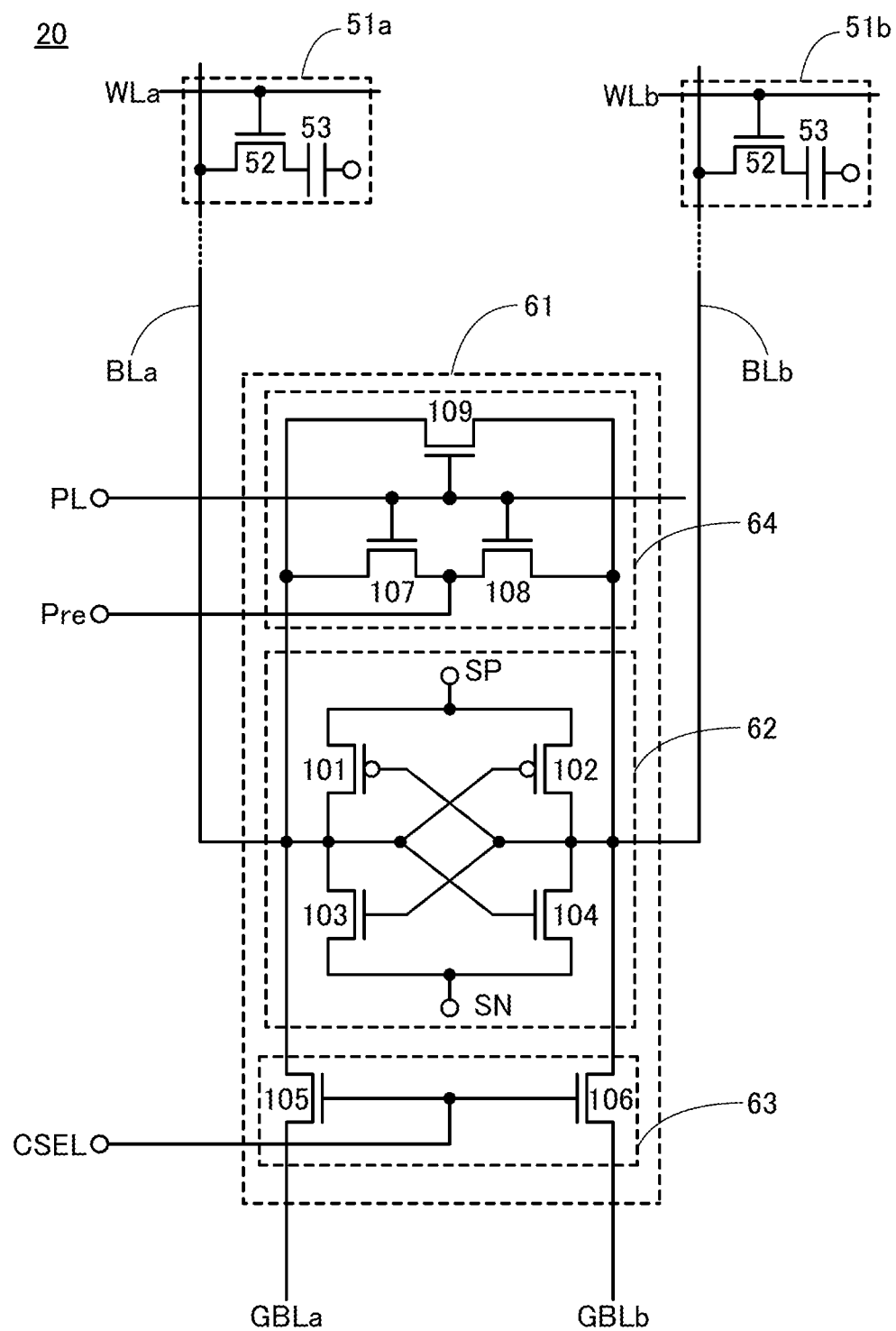
FIG. 5 is a circuit diagram illustrating a configuration example of a memory circuit.

FIG. 5 illustrates an example of a circuit configuration of the memory cells 51 and the sense amplifier 61 electrically connected to the memory cells 51. The memory cells 51 are connected to the sense amplifier 61 through the wirings BL. In the example shown here, the memory cell 51a is connected to the sense amplifier 61 through the wiring BLa, and the memory cell 51b is connected to the sense amplifier 61 through the wiring BLb.

In the example of FIG. 5, one memory cell 51 is connected to one wiring BL; however, a plurality of memory cells 51 may be connected to one wiring BL.

The memory cell 51 may include the transistor 52 having the backgate as illustrated in FIGS. 21A and 21B.

The sense amplifier 61 includes the amplifier circuit 62, the switch circuit 63, and a precharge circuit 64.

The amplifier circuit 62 includes p-channel transistors 101 and 102 and n-channel transistors 103 and 104. One of a source and a drain of the transistor 101 is connected to a wiring SP, and the other thereof is connected to a gate of the transistor 102, a gate of the transistor 104, and the wiring BLa. One of a source and a drain of the transistor 103 is connected to the gate of the transistor 102, the gate of the transistor 104, and the wiring BLa, and the other thereof is connected to a wiring SN. One of a source and a drain of the transistor 102 is connected to the wiring SP, and the other thereof is connected to a gate of the transistor 101, a gate of the transistor 103, and the wiring BLb. One of a source and a drain of the transistor 104 is connected to the gate of the transistor 101, the gate of the transistor 103, and the wiring BLb, and the other thereof is connected to the wiring SN. The amplifier circuit 62 has a function of amplifying the potential of the wiring BLa and the potential of the wiring BLb. In FIG. 5, the sense amplifier 61 including the amplifier circuit 62 functions as a latch sense amplifier.

The switch circuit 63 includes n-channel transistors 105 and 106. The transistors 105 and 106 may be p-channel transistors. One of a source and a drain of the transistor 105 is connected to the wiring BLa, and the other thereof is connected to the wiring GBLa. One of a source and a drain of the transistor 106 is connected to the wiring BLb, and the other thereof is connected to the wiring GBLb. Gates of the transistor 105 and the transistor 106 are connected to the wiring CSEL. The switch circuit 63 has a function of controlling electrical connection between the wiring BLa and the wiring GBLa and electrical connection between the wiring BLb and the wiring GBLb on the basis of a potential supplied to the wiring CSEL.

The precharge circuit 64 includes n-channel transistors 107, 108, and 109. The transistors 107, 108, and 109 may be p-channel transistors. One of a source and a drain of the transistor 107 is connected to the wiring BLa, and the other thereof is connected to a wiring Pre. One of a source and a drain of the transistor 108 is connected to the wiring BLb, and the other thereof is connected to the wiring Pre. One of a source and a drain of the transistor 109 is connected to the wiring BLa, and the other thereof is connected to the wiring BLb. A gate of the transistor 107, a gate of the transistor 108, and a gate of the transistor 109 are connected to a wiring PL. The precharge circuit 64 has a function of initializing the potentials of the wiring BLa and the wiring BLb.

The amplifier circuit 62, the switch circuit 63, and the precharge circuit 64 are preferably positioned so as to overlap with the memory cells 51.

<Operation Example of Sense Amplifier>

Next, operation examples of the memory cells 51 and the sense amplifier 61 illustrated in FIG. 5 in data reading will be described with reference to a timing chart of FIG. 6.

First, in a period T1, the transistors 107 to 109 included in the precharge circuit 64 are turned on, so that the potentials of the wirings BLa and BLb are initialized. Specifically, a high-level potential VH_PL is supplied to the wiring PL, whereby the transistors 107 to 109 in the precharge circuit 64 are turned on. Accordingly, a potential Vpre of the wiring Pre is supplied to the wirings BLa and BLb. Note that the potential Vpre can be, for example, (VH_SP+VL_SN)/2.

Note that in the period T1, a low-level potential VL_CSEL is supplied to the wiring CSEL, and accordingly, the transistors 105 and 106 in the switch circuit 63 are off. A low-level potential VL_WL is supplied to the wiring WLa, and accordingly, the transistor 52 in the memory cell 51a is off. The low-level potential VL_WL is also supplied to the wiring WLb, and accordingly, the transistor 52 in the memory cell 51b is off (not shown in FIG. 6). The potential Vpre is supplied to the wirings SP and SN, and accordingly, the amplifier circuit 62 is off.

Then, a low-level potential VL_PL is supplied to the wiring PL to turn off the transistors 107 to 109 in the precharge circuit 64. In a period T2, the wiring WLa is selected. Specifically, in FIG. 6, a high-level potential VH_WL is supplied to the wiring WLa to select the wiring WLa and turn on the transistor 52 in the memory cell 51a. The wiring BLa and the capacitor 53 are thus electrically connected to each other through the transistor 52. Since the wiring BLa and the capacitor 53 are electrically connected to each other, the potential of the wiring BLa changes according to the amount of charge held in the capacitor 53.

Figure 6:
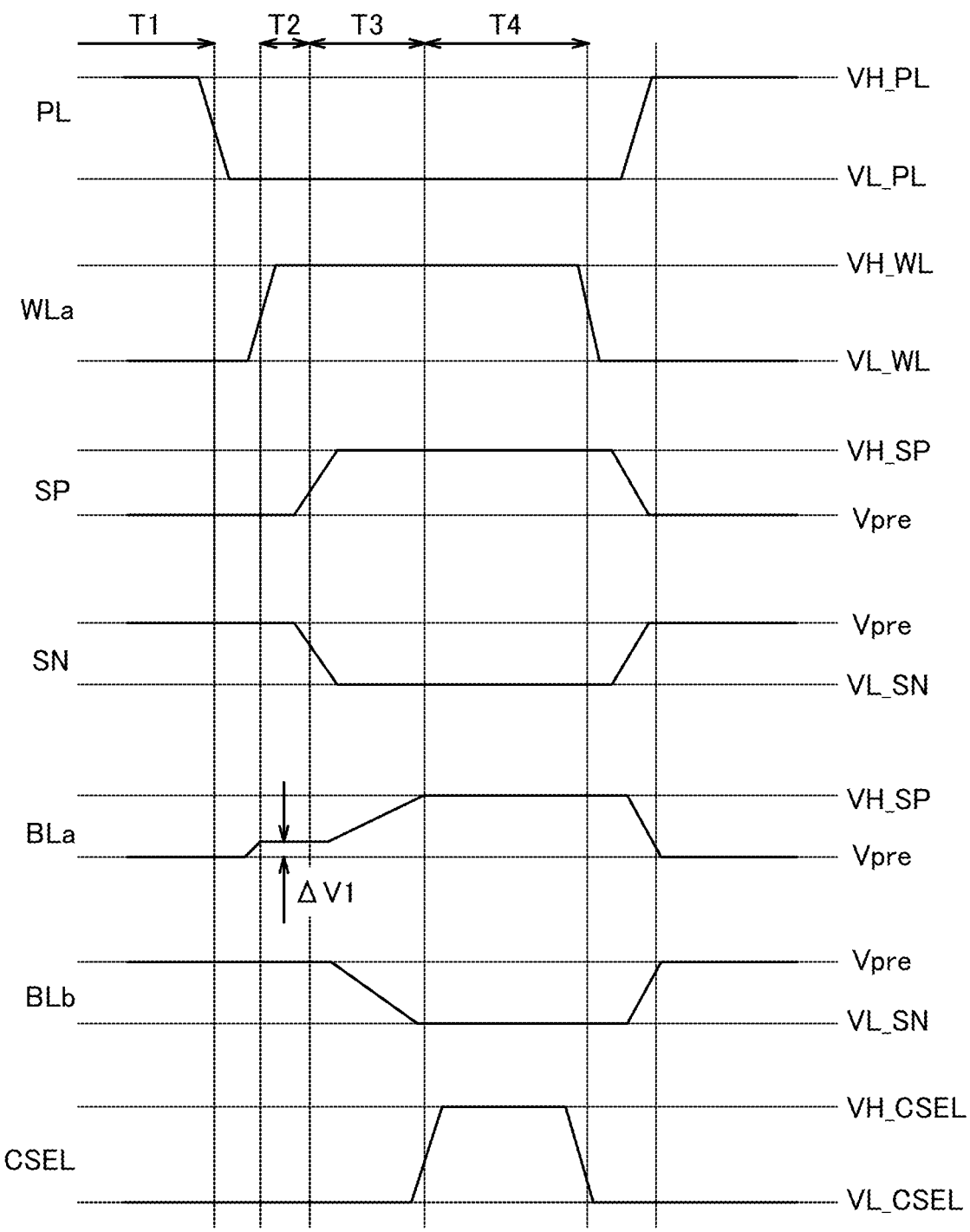
FIG. 6 is a timing chart.

The timing chart in FIG. 6 shows, as an example, the case where the amount of charge accumulated in the capacitor 53 is large. Specifically, in the case where the amount of charge accumulated in the capacitor 53 is large, charge is released from the capacitor 53 to the wiring BLa, so that the potential of the wiring BLa rises from the potential Vpre by ΔV1. In the case where the amount of charge accumulated in the capacitor 53 is small, charge flows from the wiring BLa into the capacitor 53, so that the potential of the wiring BLa falls by ΔV2.

Note that in the period T2, the low-level potential VL_CSEL is kept supplied to the wiring CSEL, and thus the transistors 105 and 106 in the switch circuit 63 remain off. The potential Vpre is kept supplied to the wirings SP and SN, and thus the sense amplifier 61 remains off.

In a period T3, the high-level potential VH_SP is supplied to the wiring SP and the low-level potential VL_SN is supplied to the wiring SN, whereby the amplifier circuit 62 is turned on. The amplifier circuit 62 has a function of amplifying the potential difference between the wirings BLa and BLb (ΔV1 in FIG. 6). Accordingly, in the timing chart in FIG. 6, the amplifier circuit 62 is turned on, whereby the potential of the wiring BLa rises from the potential Vpre+ΔV1 to approach the potential VH_SP of the wiring SP. The potential of the wiring BLb falls from the potential Vpre to approach the potential VL_SN of the wiring SN.

Note that in the case where the potential of the wiring BLa is Vpre-ΔV2 at the beginning of the period T3, the amplifier circuit 62 is turned on, whereby the potential of the wiring BLa falls from the potential Vpre-ΔV2 to approach the potential VL_SN of the wiring SN. The potential of the wiring BLb rises from the potential Vpre to approach the potential VH_SP of the wiring SP.

In the period T3, the low-level potential VL_PL is kept supplied to the wiring PL to keep the transistors 107 to 109 in the precharge circuit 64 off. The low-level potential VL_CSEL is kept supplied to the wiring CSEL, thereby keeping the transistors 105 and 106 in the switch circuit 63 off. The high-level potential VH_WL is kept supplied to the wiring WLa; thus, the transistor 52 in the memory cell 51a remains on. Consequently, charge corresponding to the potential VH_SP of the wiring BLa is accumulated in the capacitor 53 in the memory cell 51a.

Next, in a period T4, the potential supplied to the wiring CSEL is changed to turn on the switch circuit 63. Specifically, in FIG. 6, a high-level potential VH_CSEL is supplied to the wiring CSEL, so that the transistors 105 and 106 in the switch circuit 63 are turned on. Accordingly, the potential of the wiring BLa is supplied to the wiring GBLa, and the potential of the wiring BLb is supplied to the wiring GBLb.

In the period T4, the low-level potential VL_PL is still supplied to the wiring PL, so that the transistors 107 to 109 in the precharge circuit 64 remain off. The high-level potential VH_WL is kept supplied to the wiring WLa; thus, the transistor 52 in the memory cell 51a remains on. The high-level potential VH_SP is kept supplied to the wiring SP and the low-level potential VL_SN is kept supplied to the wiring SN; thus, the amplifier circuit 62 remains on. As a result, charge corresponding to the potential VH_SP of the wiring BLa is accumulated in the capacitor 53 in the memory cell 51a.

When the period T4 is over, the potential supplied to the wiring CSEL is changed to turn off the switch circuit 63. Specifically, in FIG. 6, the low-level potential VL_CSEL is supplied to the wiring CSEL, so that the transistors 105 and 106 in the switch circuit 63 are turned off.

Furthermore, when the period T4 is over, the wiring WLa is deselected. Specifically, in FIG. 6, the low-level potential VL_WL is supplied to the wiring WLa, whereby the wiring WLa is deselected to turn off the transistor 52 in the memory cell 51a. Through the operation, charge corresponding to the potential VH_SP of the wiring BLa is held in the capacitor 53; thus, data is held in the memory cell 51a even after the data is read out.

Through the operation in the periods T1 to T4, data is read from the memory cell 51a. Data in the memory cell 51b can be read similarly.

Note that data can be written to the memory cell 51 on the basis of the above principle. Specifically, as in the case where data is read, first, the transistors 107 to 109 in the precharge circuit 64 are temporarily turned on to initialize the potentials of the wirings BLa and BLb. Then, the wiring WLa connected to the memory cell 51a to which data is to be written or the wiring WLb connected to the memory cell 51b to which data is to be written is selected to turn on the transistor 52 in the memory cell 51a or 51b. The wiring BLa or BLb and the capacitor 53 are thus electrically connected to each other through the transistor 52. Then, the high-level potential VH_SP is supplied to the wiring SP and the low-level potential VL_SN is supplied to the wiring SN to turn on the amplifier circuit 62. The potential supplied to the wiring CSEL is then changed to turn on the switch circuit 63. Specifically, the high-level potential VH_CSEL is supplied to the wiring CSEL, so that the transistors 105 and 106 in the switch circuit 63 are turned on. Consequently, the wirings BLa and GBLa are electrically connected to each other and the wirings BLb and GBLb are electrically connected to each other. Writing potentials are supplied to the wirings GBLa and GBLb, whereby the writing potentials are supplied to the wirings BLa and BLb through the switch circuit 63. Consequently, charge is accumulated in the capacitor 53 according to the potential of the wiring BLa or BLb and thus data is written to the memory cell 51a or 51b.

Note that after the potential of the wiring GBLa is supplied to the wiring BLa and the potential of the wiring GBLb is supplied to the wiring BLb, the relation in level between the potential of the wiring BLa and the potential of the wiring BLb is maintained by the amplifier circuit 62 as long as the sense amplifier 61 is on even after the transistors 105 and 106 in the switch circuit 63 are turned off. Therefore, the timing of turning off the transistors 105 and 106 in the switch circuit 63 may be either before or after the wiring WLa is selected.

As described above, in one embodiment of the present invention, the wiring GBL is shared by the plurality of wirings BL; the sense amplifier circuit 60 has a function of selecting some of the plurality of wiring BL and outputting the potentials of the selected wirings BL to the wirings GBL. Therefore, the number of the wirings GBL can be reduced, the distance $S_{GBL}$ between the wirings GBL can be lengthened, and the parasitic capacitance generated between the wirings GBL can be reduced. As a result, the power consumption of the semiconductor device 10 can be reduced.

Furthermore, in one embodiment of the present invention, parasitic capacitance is reduced as a result of a reduction in the number of the wirings GBL, and thus signals of the wirings GBL can be directly output to the input/output circuit 40 without being amplified; therefore, the main amplifier 30 can be omitted. Accordingly, the power consumption and the area of the semiconductor device 10 can be reduced.

In one embodiment of the present invention, the sense amplifier circuit 60 can select signals to be output from the input/output circuit 40 to the outside from among the signals output from the wirings BL. Therefore, the input/output circuit 40 does not need to select some of the plurality of signals. Accordingly, the configuration of the input/output circuit 40 can be simplified, and the area thereof can be reduced.

In Embodiment 1, one embodiment of the present invention has been described. Other embodiments of the present invention will be described in Embodiments 2 to 6. Note that one embodiment of the present invention is not limited thereto. That is, various embodiments of the invention are described in Embodiments 1 to 6, and thus one embodiment of the present invention is not limited to a specific embodiment. Although an example in which one embodiment of the present invention is applied to a memory is described, one embodiment of the present invention is not limited thereto. Depending on circumstances or conditions, one embodiment of the present invention may be applied to another circuit. Furthermore, depending on circumstances or conditions, one embodiment of the present invention is not necessarily applied to a memory. Although an example in which a channel formation region of a transistor includes an oxide semiconductor is described as one embodiment of the present invention, one embodiment of the present invention is not limited thereto. Depending on circumstances or conditions, in one embodiment of the present invention, a transistor may include another semiconductor material such as silicon, germanium, silicon germanium, silicon carbide, gallium arsenide, aluminum gallium arsenide, indium phosphide, gallium nitride, or an organic semiconductor. Furthermore, depending on circumstances or conditions, in one embodiment of the present invention, a transistor does not necessarily include an oxide semiconductor.

The structure and method described in this embodiment can be combined as appropriate with any of the other structures and methods described in the other embodiments. Note that a content (or part thereof) described in this embodiment can be applied to, combined with, or replaced with another content (or part thereof) described in this embodiment and/or a content (or part thereof) described in another or other embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in another or other embodiments, much more diagrams can be formed. This applies also to other embodiments.

Embodiment 2

In this embodiment, another configuration example of a memory circuit of one embodiment of the present invention will be described.

Figure 7:
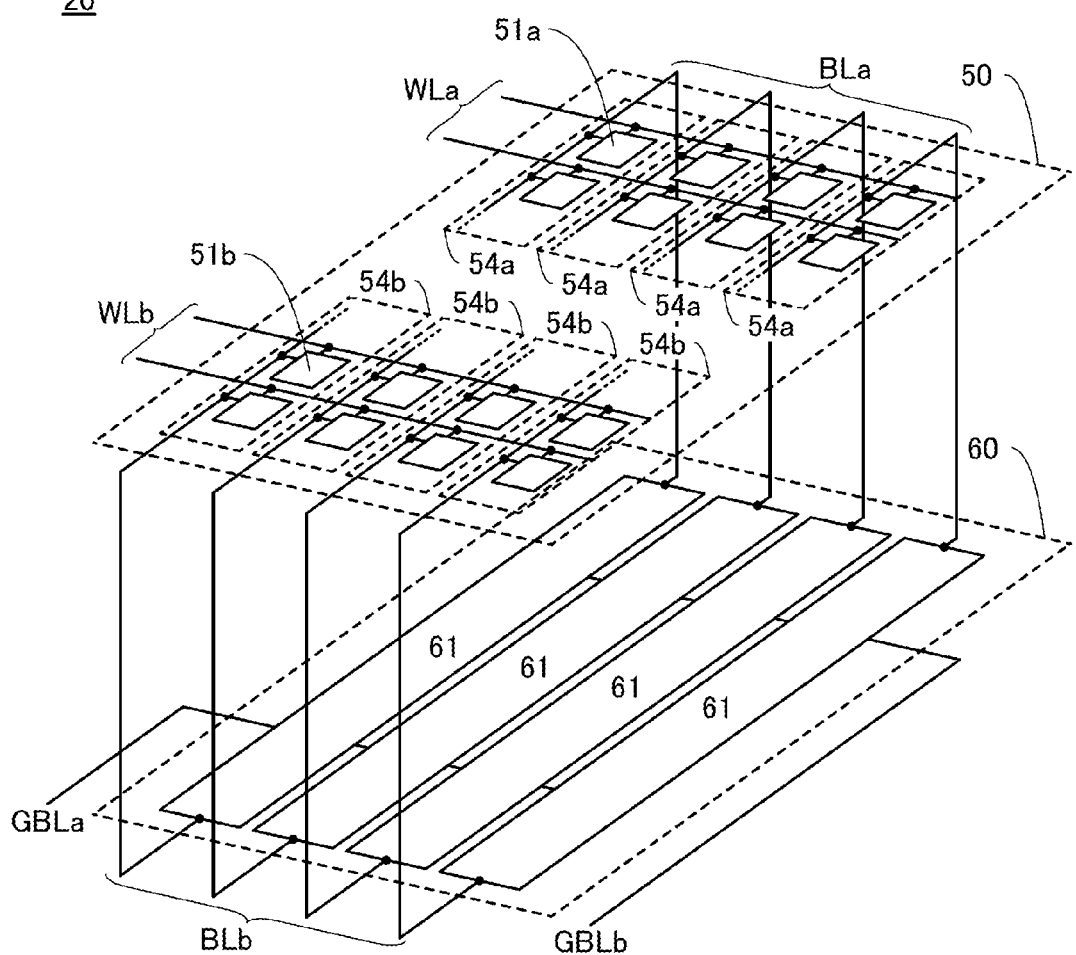
FIG. 7 illustrates a configuration example of a memory circuit.
Figure 8:
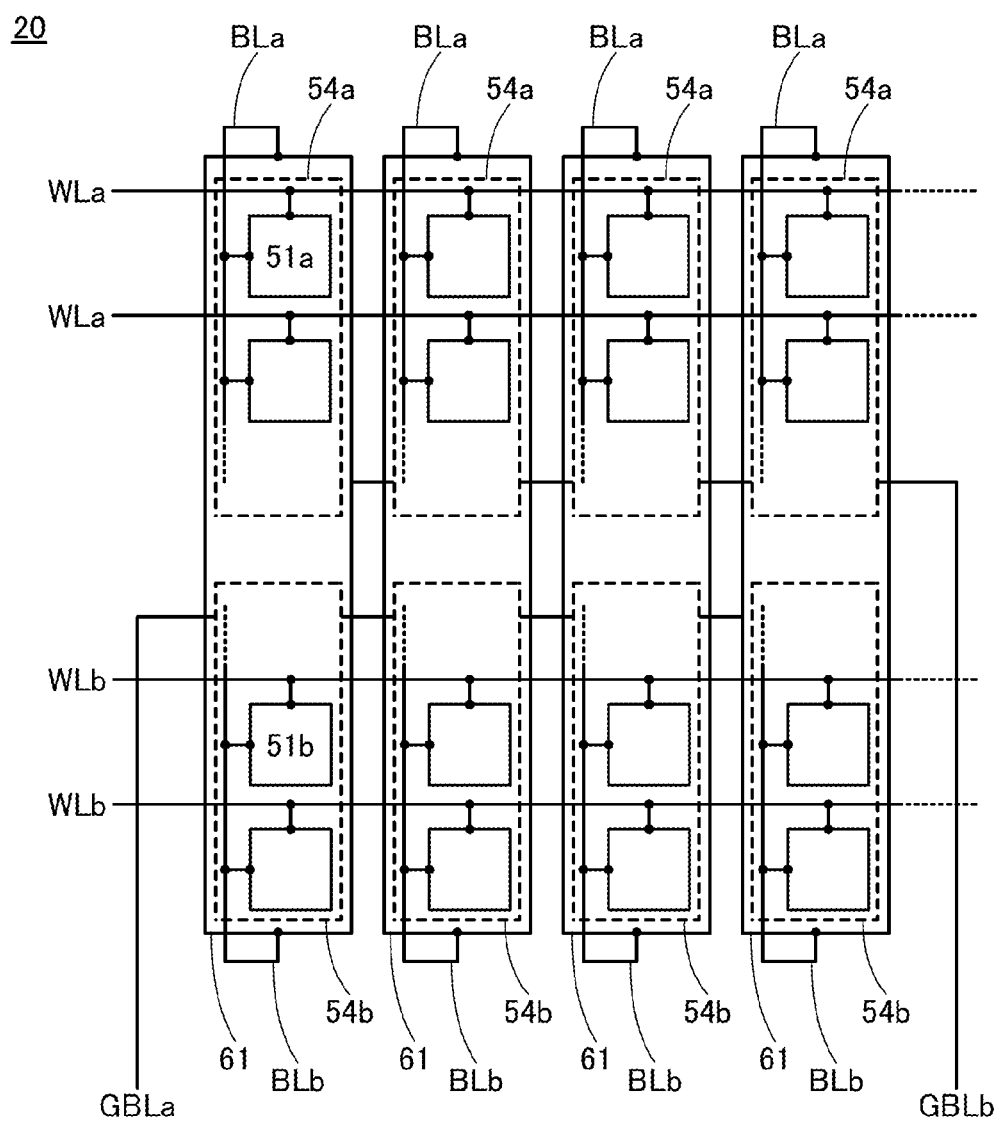
FIG. 8 illustrates a configuration example of a memory circuit.

FIG. 7 illustrates a configuration example of the memory circuit 20. FIG. 8 is a top view of the memory circuit 20 illustrated in FIG. 7. Like the memory circuit 20 illustrated in FIGS. 2A to 2C, the memory circuit 20 illustrated in FIG. 7 and FIG. 8 has a structure in which the memory cells 51 are stacked over the sense amplifiers 61. The memory circuit 20 includes the cell array 50 having an open-type layout.

The memory circuit 20 in FIG. 7 and FIG. 8 includes four sets of one sense amplifier 61 positioned in a first layer and a plurality of memory cells 51a and a plurality of memory cells 51b which are connected to the sense amplifier 61 and are positioned in a second layer. Note that the number of sets included in the memory circuit 20 of one embodiment of the present invention may be one, two, three, or more than four.

In FIG. 7 and FIG. 8, a region 54a including the plurality of memory cells 51a and a region 54b including the plurality of memory cells 51b overlap with one sense amplifier 61 connected to the plurality of memory cells 51a and the plurality of memory cells 51b.

In FIG. 7 and FIG. 8, the sense amplifier 61 is connected to the wiring BLa and the wiring BLb. The plurality of memory cells 51a in one region 54a are connected to the same wiring BLa. The plurality of memory cells 51b in one region 54b are connected to the same wiring BLb.

The plurality of wirings WLa are shared by four regions 54a, and the plurality of wirings WLb are shared by four regions 54b. Specifically, one wiring WLa is connected to four memory cells 51a, and one wiring WLb is connected to four memory cells 51b.

Since the cell array 50 in FIG. 7 and FIG. 8 has an open-type layout, the wirings BLa do not intersect with the wirings WLb, and the wirings BLb do not intersect with the wirings WLa.

Each of the sense amplifiers 61 is connected to the wiring GBLa and the wiring GBLb.

With such a configuration, the area of the memory circuit 20 can be reduced, and the storage capacity per unit area of the memory circuit 20 can be increased.

The structure and method described in this embodiment can be combined as appropriate with any of the other structures and methods described in the other embodiments.

Embodiment 3

In this embodiment, a structure example of a memory device of one embodiment of the present invention will be described.

Figure 9:
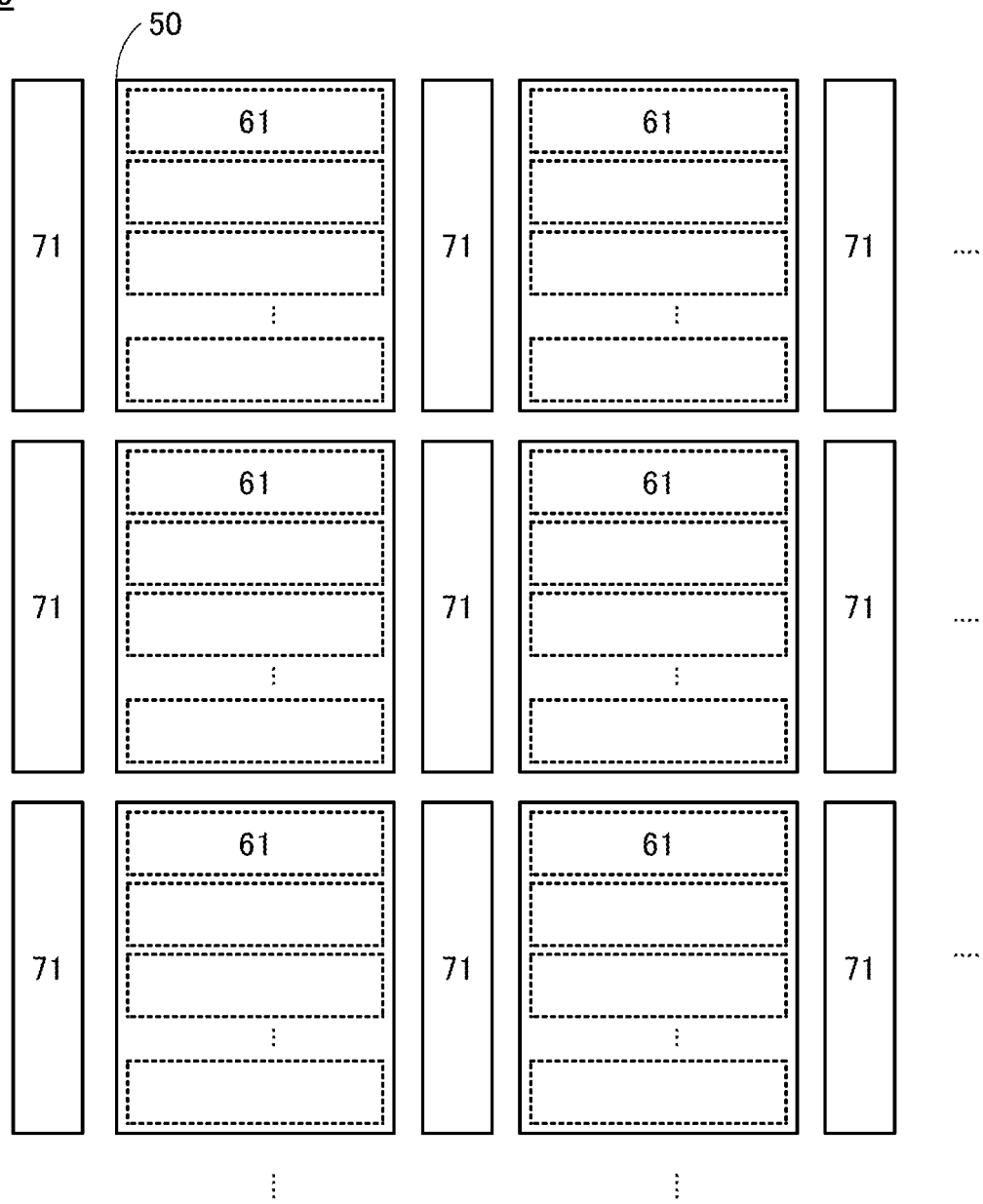
FIG. 9 illustrates a structure example of an array.

FIG. 9 illustrates a structure example of an array 80. The array 80 includes the cell arrays 50 each including the memory cells 51 (not illustrated), the sense amplifiers 61, and row decoders 71 for controlling the potentials of the wirings WL.

In the array 80 illustrated in FIG. 9, the plurality of sense amplifiers 61 positioned in a first layer overlap with the cell array 50 positioned in a second layer. The number of the memory cells 51 in the cell array 50 and the number of the sense amplifiers 61 overlapping with the cell array 50 can be determined by a designer as appropriate.

The row decoder 71 is positioned in the first layer or the second layer. The row decoder 71 has a function of controlling the potentials of the wirings WL connected to the memory cells 51 in the cell array 50 which is adjacent to the row decoder 71.

Figure 10:
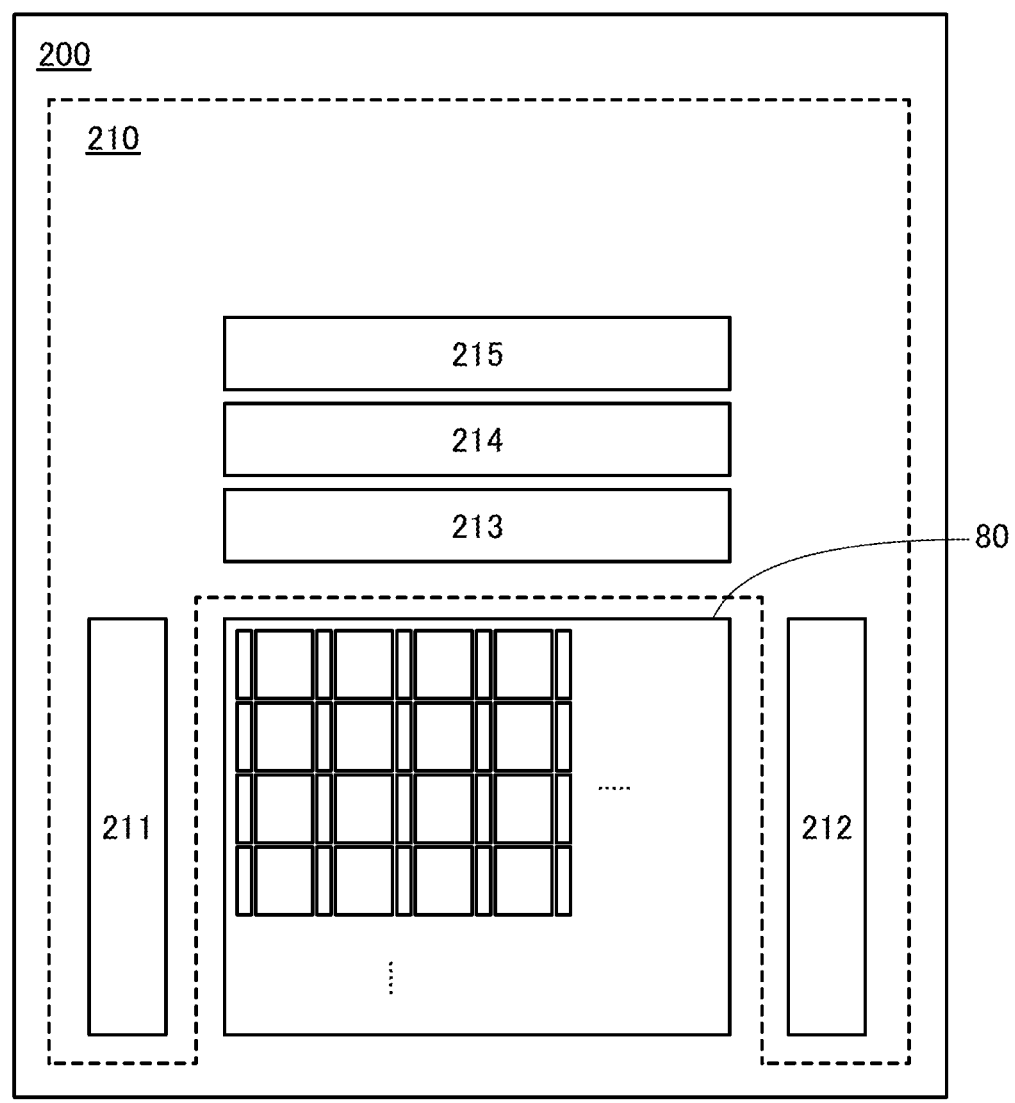
FIG. 10 illustrates a structure example of a memory device.

FIG. 10 illustrates a structure example of the memory device 200 including the array 80 illustrated in FIG. 9 and a driver circuit 210 which controls the operation of the array 80.

In the memory device 200 illustrated in FIG. 10, the driver circuit 210 includes a row decoder 211, a column decoder 212, a main amplifier 213, a writing circuit 214, and a buffer 215.

The row decoder 211 has a function of selecting some of the plurality of row decoder 71 included in the array 80 in FIG. 9 on the basis of a specified address. The wirings WL (not illustrated) are selected by the row decoders 71 that are selected by the row decoder 211.

The column decoder 212 has a function of selecting the memory cells 51 in the column direction at the time of data writing or reading on the basis of a specified address. Specifically, the column decoder 212 has a function of controlling the potential of the wiring CSEL in the memory circuit 20 illustrated in FIG. 5.

The main amplifier 213 has a function of amplifying the potentials of the wirings GBL for data reading. Note that the main amplifier 213 corresponds to the main amplifier 30 in FIG. 1.

The writing circuit 214 has a function of writing data to the memory cell 51 in the specified address. Specifically, in the memory circuit 20 illustrated in FIG. 5, the writing circuit 214 has a function of supplying a potential to the wiring GBL on the basis of data input from the outside.

The buffer 215 has a function of controlling input to the memory device 200 of signals used for driving the driver circuit 210 or the array 80 and data written to the array 80. In addition, the buffer 215 has a function of controlling output from the memory device 200 of data read out from the array 80.

The writing circuit 214 and the buffer 215 correspond to the input/output circuit 40 in FIG. 1.

Note that the memory device 200 may include an address buffer that can temporarily store the address of the specified memory cell 51.

The structure and method described in this embodiment can be combined as appropriate with any of the other structures and methods described in the other embodiments.

Embodiment 4

In this embodiment, an example of a cross-sectional structure of a semiconductor device of one embodiment of the present invention will be described.

Structure Example 1

Figure 11:
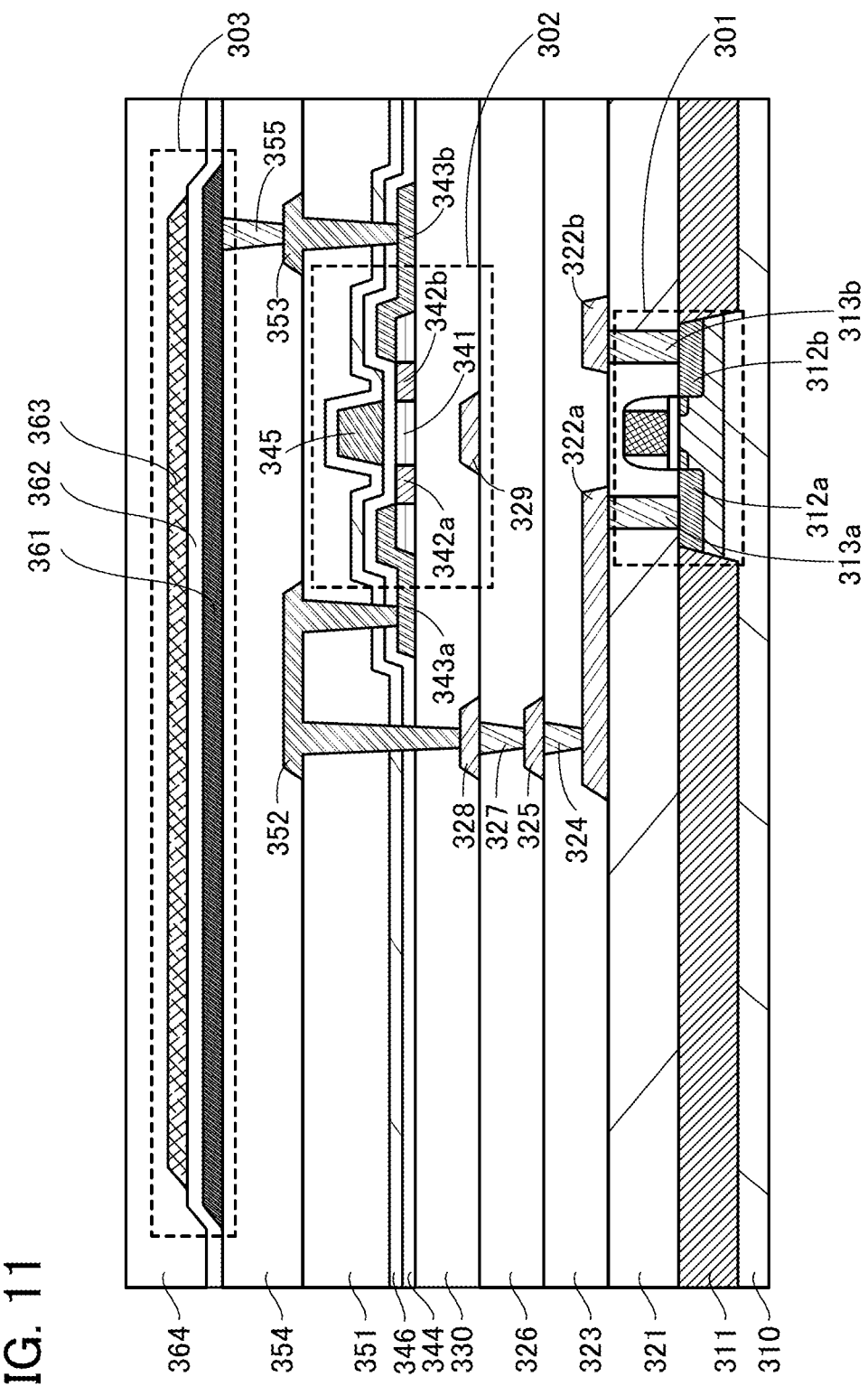
FIG. 11 illustrates a structure example of a semiconductor device.

FIG. 11 is a cross-sectional view illustrating a transistor 301, a transistor 302, and a capacitor 303. The transistor 302 can be used as the transistor 52 in FIG. 2C, and the capacitor 303 can be used as the capacitor 53 in FIG. 2C. The transistor 301 connected to the transistor 302 can be used as the transistors 101 to 109 in FIG. 5 and the like. FIG. 11 illustrates a cross-sectional structure of a semiconductor device in which the transistor 301 having a channel formation region in a single crystal semiconductor substrate is positioned in a first layer, the transistor 302 that is an OS transistor is positioned in a second layer over the first layer, and the capacitor 303 is positioned in a third layer over the second layer.

The transistor 301 may have a channel formation region in a semiconductor film or a semiconductor substrate of silicon, germanium, or the like in an amorphous, microcrystalline, polycrystalline, or single crystal state. In the case where the transistor 301 is formed using a thin silicon film, any of the following can be used: amorphous silicon formed by sputtering or vapor phase growth such as plasma CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 310 where the transistor 301 is formed can be, for example, a silicon substrate, a germanium substrate, or a silicon germanium substrate. In FIG. 11, a single crystal silicon substrate is used as the semiconductor substrate 310.

The transistor 301 is electrically isolated by an element isolation method. As the element isolation method, a local oxidation of silicon (LOCOS) method, a shallow trench isolation (STI) method, or the like can be employed. In FIG. 11, an example in which the trench isolation method is used to electrically isolate the transistor 301 is shown. Specifically, in the example illustrated in FIG. 11, to electrically isolate the transistor 301, after trenches are formed in the semiconductor substrate 310 by etching or the like, element separation regions 311 are formed by embedding an insulator such as silicon oxide in the trenches.

The transistor 301 includes an impurity region 312a and an impurity region 312b. The impurity region 312a and the impurity region 312b function as a source and a drain of the transistor 301.

In an insulating film 321 which covers the transistor 301, openings are formed. A conductive layer 313a connected to the impurity region 312a and a conductive layer 313b connected to the impurity region 312b are formed in the openings. The conductive layer 313a is connected to a conductive layer 322a formed over the insulating film 321, and the conductive layer 313b is connected to a conductive layer 322b formed over the insulating film 321.

An insulating film 323 is provided over the conductive layer 322a and the conductive layer 322b, and an opening is formed in the insulating film 323. A conductive layer 324 connected to the conductive layer 322a is formed in the opening. The conductive layer 324 is connected to a conductive layer 325 formed over the insulating film 323.

An insulating film 326 is provided over the conductive layer 325, and an opening is formed in the insulating film 326. A conductive layer 327 connected to the conductive layer 325 is formed in the opening. The conductive layer 327 is connected to a conductive layer 328 formed over the insulating film 326.

Over the insulating film 326, the transistor 302 that is an OS transistor is provided. The transistor 302 includes an oxide semiconductor layer 341 over an insulating film 330, conductive layers 343a and 343b over the oxide semiconductor layer 341, an insulating film 344 over the oxide semiconductor layer 341 and the conductive layers 343a and 343b, and a conductive layer 345 which is positioned over the insulating film 344 and overlaps with the oxide semiconductor layer 341. Note that the conductive layers 343a and 343b function as a source electrode and a drain electrode of the transistor 302, the insulating film 344 functions as a gate insulating film of the transistor 302, and the conductive layer 345 functions as a gate electrode of the transistor 302.

The oxide semiconductor layer 341 includes a region 342a between a region overlapping with the conductive layer 343a and a region overlapping with the conductive layer 345. The oxide semiconductor layer 341 also includes a region 342b between a region overlapping with the conductive layer 343b and the region overlapping with the conductive layer 345. Argon or an impurity imparting p-type or n-type conductivity to the oxide semiconductor layer 341 is added to the regions 342a and 342b with the conductive layers 343a, 343b, and 345 used as masks; thus, in the oxide semiconductor layer 341, the resistivity of the region 342a and the region 342b can be lower than that of the region overlapping with the conductive layer 345.

An insulating film 346 and an insulating film 351 are provided over the insulating film 344 and the conductive layer 345. Over the insulating film 351, a conductive layer 352 and a conductive layer 353 are provided. The conductive layer 352 is connected to the conductive layer 328 through an opening provided in the insulating films 330, 344, 346, and 351, and is connected to the conductive layer 343a through an opening provided in the insulating films 344, 346, and 351. The conductive layer 353 is connected to the conductive layer 343b through an opening provided in the insulating films 344, 346, and 351. The conductive layer 352 functions as the wiring BL described in any of Embodiments 1 to 3 or as a conductive layer that connects the conductive layer 343a and the wiring BL.

An insulating film 354 is provided over the conductive layer 352 and the conductive layer 353. Over the insulating film 354, the capacitor 303 is provided.

The capacitor 303 includes a conductive layer 361 over the insulating film 354, an insulating film 362 over the conductive layer 361, and a conductive layer 363 overlapping with the conductive layer 361 with the insulating film 362 therebetween. Over the conductive layer 363, an insulating film 364 is provided. The conductive layer 361 is connected to the conductive layer 353 through a conductive layer 355 provided in an opening in the insulating film 354. The conductive layer 361 and the conductive layer 363 function as electrodes of the capacitor 303, and the insulating film 362 functions as a dielectric of the capacitor 303.

In the semiconductor device illustrated in FIG. 11, the conductive layers 322a, 324, 325, 327, 328, and 352 that connect the conductive layer 313a functioning as a source electrode or a drain electrode of the transistor 301 and the conductive layer 343a functioning as the source electrode or the drain electrode of the transistor 302 function as the wirings BL described in any of Embodiments 1 to 3. In addition to these conductive layers, the conductive layer 313a or the conductive layer 343a can also function as the wiring BL.

Further, in FIG. 11, the transistor 302 includes the conductive layer 345 on at least one side of the oxide semiconductor layer 341. Alternatively, a pair of gate electrodes may be provided with the oxide semiconductor layer 341 therebetween. For example, a conductive layer 329 functioning as a backgate of the transistor 302 is provided over the insulating film 326, whereby a pair of gate electrodes can be provided in the transistor 302.

In FIG. 11, the transistor 302 has a single-gate structure in which one channel formation region corresponding to one conductive film 345 is provided. However, the transistor 302 may have a multi-gate structure in which a plurality of connected gate electrodes is provided so that a plurality of channel formation regions is included in the oxide semiconductor layer 341.

The transistor 301, the transistor 302, and the capacitor 303 are stacked in this manner, whereby the area of the semiconductor device can be reduced. Note that the capacitor 303 preferably overlaps with the transistor 302, in which case the area of the memory cell 51 in FIG. 2C and the like can be reduced while the capacitance of the memory cell 51 can be ensured.

For example, when the conductive layer 361 or the conductive layer 363 overlaps with the oxide semiconductor layer 341 or the conductive layer 345, the area of the memory cell 51 can be further reduced.

In FIG. 11, for example, the area of the memory cell 51 can be 0.54 $\mu m^2$ or smaller when the channel length of the transistor 301 is 65 nm, the channel length of the transistor 302 is 60 nm, and the capacitor 303 is stacked over the transistor 302.

Structure Example 2

Figure 12:
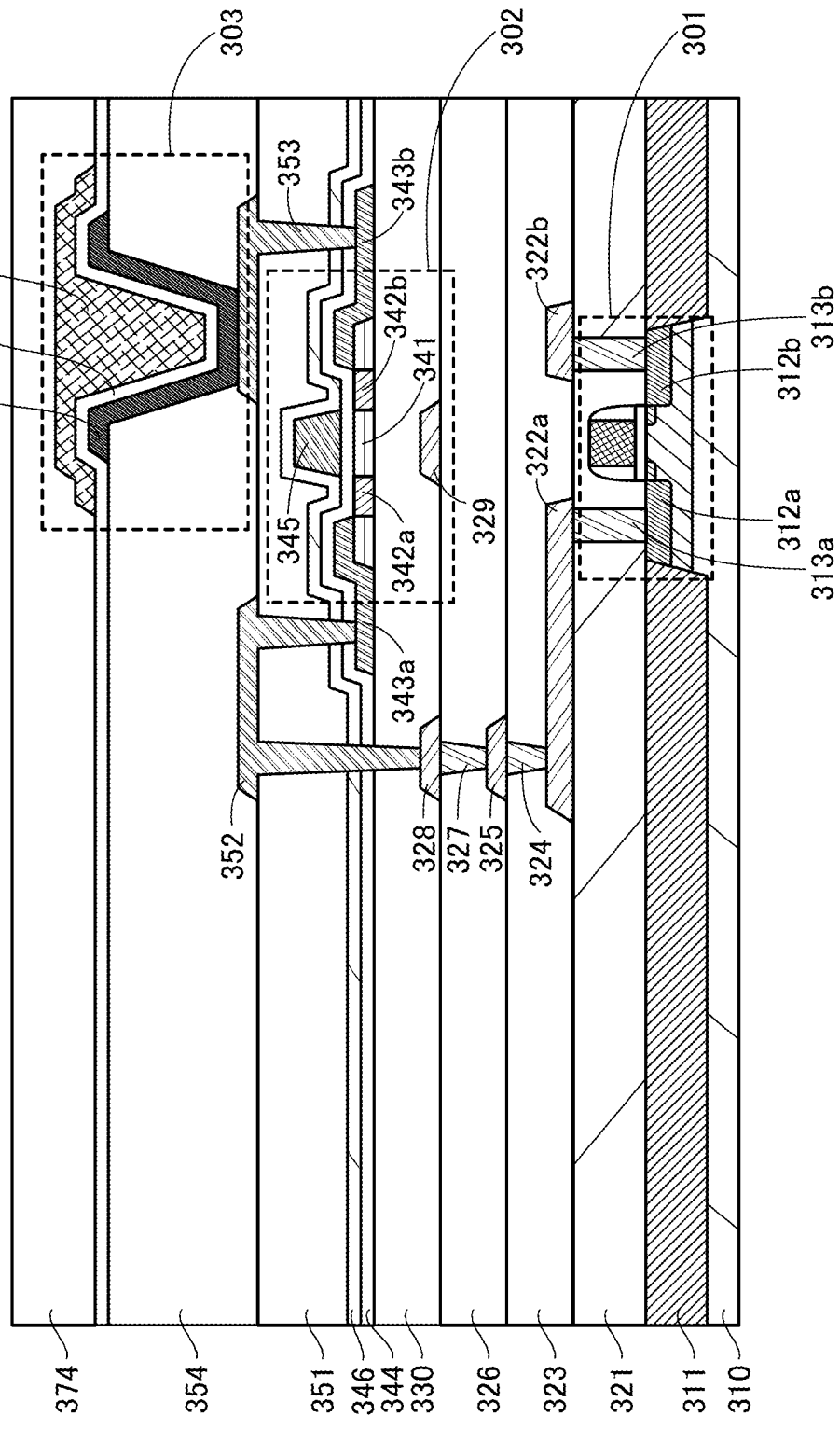
FIG. 12 illustrates a structure example of a semiconductor device.

FIG. 12 is a cross-sectional view of a semiconductor device which is different from the semiconductor device in FIG. 11. FIG. 12 is different from FIG. 11 only in the structure of the capacitor 303 which will be described below; therefore, for the other structures, the description with reference to FIG. 11 can be referred to.

The capacitor 303 illustrated in FIG. 12 includes a conductive layer 371, an insulating film 372 over the conductive layer 371, and a conductive layer 373 overlapping with the conductive layer 371 with the insulating film 372 therebetween. Over the conductive layer 373, an insulating film 374 is provided. The conductive layer 371 and the conductive layer 373 function as electrodes of the capacitor 303, and the insulating film 372 functions as a dielectric of the capacitor 303. Note that the capacitor 303 in FIG. 11 is a planar capacitor, whereas the capacitor 303 in FIG. 12 is a cylindrical capacitor.

The conductive layer 371 is formed over the insulating film 354 and in an opening provided in the insulating film 354, and is connected to the conductive layer 353. Therefore, the conductive layer 371 includes a first region in contact with the conductive layer 353, a second region in contact with a top surface of the insulating film 354, and a third region in contact with a side surface of the insulating film 354. The insulating film 372 is provided in contact with the conductive layer 371.

The insulating layer 373 is provided over the insulating film 354 and in the opening provided in the insulating film 354 so as to overlap with the conductive layer 371 with the insulating film 372 therebetween. Accordingly, capacitance is formed on a side surface portion of the opening in the insulating film 354 in addition to over the insulating film 354 and on a bottom portion of the opening in the insulating film 354. Therefore, by making the thickness of the insulating film 354 large and forming the opening deeply in the insulating film 354, the capacitance of the capacitor 303 can be increased.

When the capacitor 303 is a cylindrical capacitor as described above, the area of the capacitor 303 can be reduced with the capacitance of the capacitor 303 kept. Consequently, the area of the memory cell 51 in FIG. 2C and the like can be further reduced.

Note that the capacitor 303 preferably overlaps with the transistor 302. For example, when the conductive layer 371 or the conductive layer 373 overlaps with the oxide semiconductor layer 341 or the conductive layer 345, the area of the memory cell 51 can be further reduced.

In FIG. 12, for example, the area of the memory cell 51 can be 0.17 $\mu m^2$ or smaller when the channel length of the transistor 301 is 65 nm, the channel length of the transistor 302 is 60 nm, and the capacitor 303 is stacked over the transistor 302.

Structure Example 3

Next, the structure of the memory cell 51 including the transistor 302 and the capacitor 303 over the transistor 302 will be described.

Figure 24A:
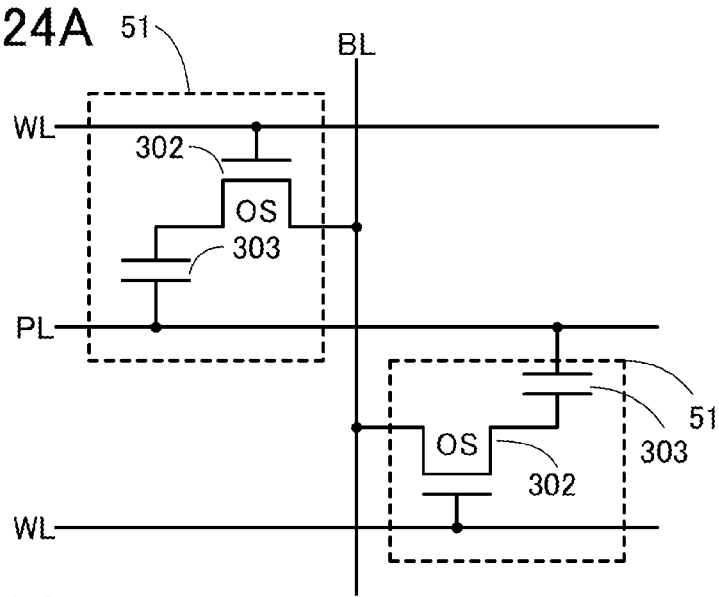
FIGS. 24A to 24C illustrate a structure example of a memory cell.

FIG. 24A illustrates an example of a circuit configuration of the memory cell 51. Here, two memory cells 51 are shown. The memory cell 51 includes the transistor 302 that is an OS transistor and the capacitor 303. The connection relations between the elements and the wirings are the same as those in FIG. 2C, and thus the detailed description thereof is omitted.

Here, the wiring BL is shared by the adjacent memory cells 51. One of electrodes of each of the capacitors 303 in the memory cells 51 is connected to the wiring PL. The wiring PL corresponds to the conductive layer 363 in FIG. 11 and the conductive layer 373 in FIG. 12.

Figure 24B:
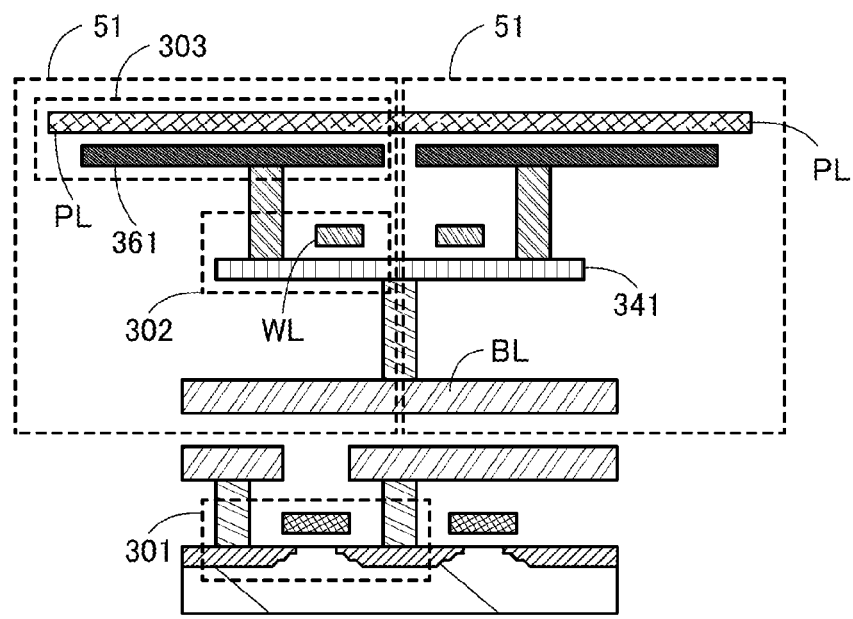

FIG. 24B is an example of a cross-sectional view of the memory cell 51 in FIG. 24A. The oxide semiconductor layer 341 is connected to the wiring BL and the conductive layer 361. Here, the oxide semiconductor layer 341 and the wiring PL are shared by the adjacent memory cells 51. The capacitor 303 includes the conductive layer 361 and the wiring PL, and is stacked over the transistor 302. Note that the capacitor 303 in FIG. 24B is a planar capacitor.

The transistor 301 provided below the transistor 302 can be used as the transistors 101 to 109 in FIG. 5 and the like. Therefore, a sense amplifier can be formed with the use of the transistor 301.

Figure 24C:
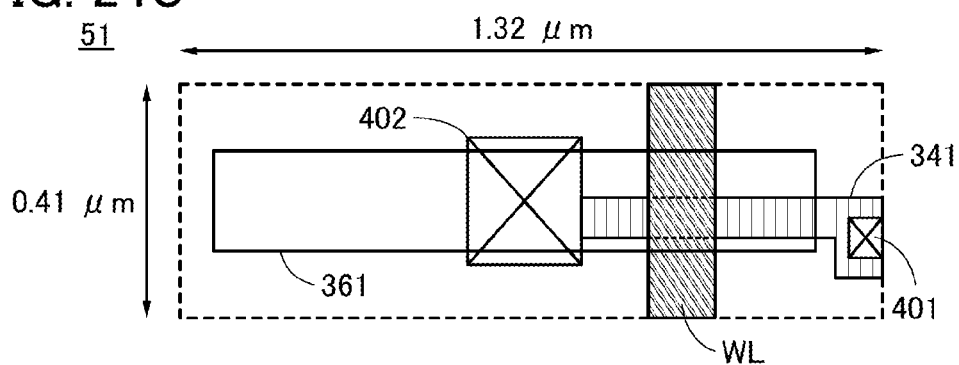

FIG. 24C is a top view of the memory cell 51 in FIG. 24B. Here, the channel length of the transistor 302 is 60 nm, and a c-axis aligned crystalline oxide semiconductor (CAAC-OS) is used for the oxide semiconductor layer 341. The oxide semiconductor layer 341 is connected to the wiring BL through an opening 401, and is connected to the conductive layer 361 of the capacitor 303 through an opening 402.

In the case where the planar capacitor 303 is stacked over the transistor 302, the lengths of the memory cell 51 can be 1.32 µm and 0.41 µm and the area thereof can be 0.54 µm² as illustrated in FIG. 24C.

Figure 25A:
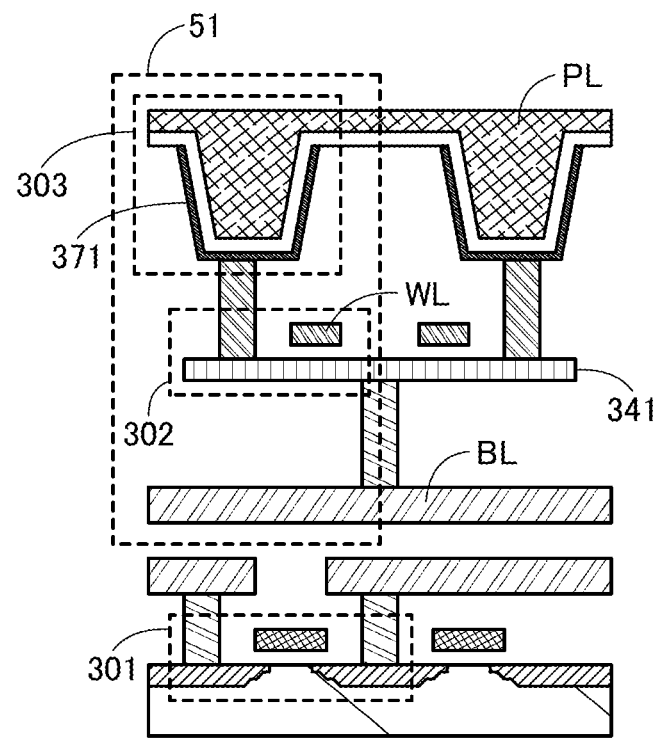
FIGS. 25A and 25B illustrate a structure example of a memory cell.

FIG. 25A is a cross-sectional view of the memory cell 51, which is different from FIG. 24B in that the capacitor 303 is a cylindrical capacitor. The oxide semiconductor layer 341 is connected to the wiring BL and the conductive layer 371. The capacitor 303 includes the conductive layer 371 and the wiring PL, and is stacked over the transistor 302.

Figure 25B:
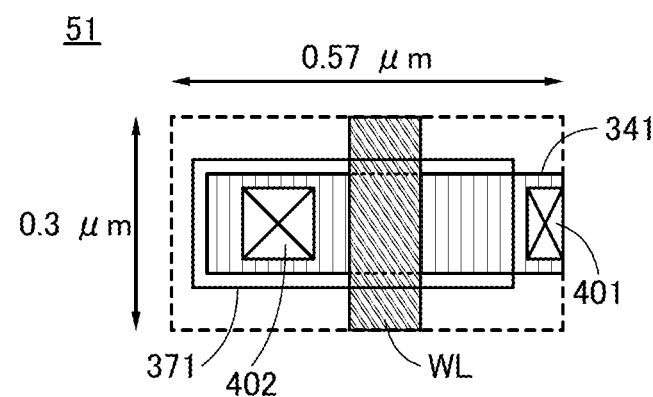

FIG. 25B is a top view of the memory cell 51 illustrated in FIG. 25A. The oxide semiconductor layer 341 is connected to the wiring BL through the opening 401, and is connected to the conductive layer 371 of the capacitor 303 through the opening 402.

In the case where the cylindrical capacitor 303 is stacked over the transistor 302, the lengths of the memory cell 51 can be 0.57 µm and 0.3 µm and the area thereof can be 0.17 µm² as illustrated in FIG. 25B. Thus, with the use of the cylindrical capacitor instead of the planar capacitor, the area of the memory cell 51 can be reduced.

Structure Example 4

Next, a structure example of the memory cell 51 which is different from Structure Example 3 will be described.

Figure 26A:
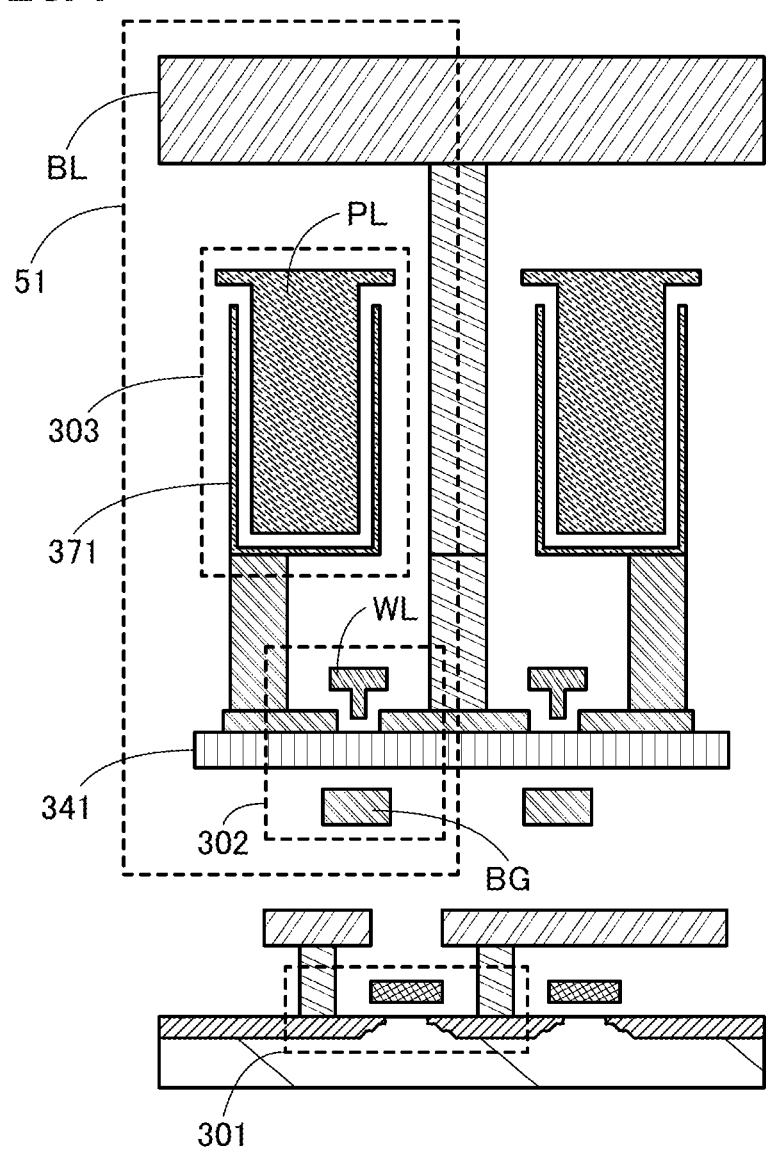
FIGS. 26A and 26B illustrate a structure example of a memory cell.

FIG. 26A is an example of a cross-sectional view of the memory cell 51 in which the capacitor 303 is a cylindrical capacitor as in FIG. 25A.

The oxide semiconductor layer 341 is connected to the wiring BL and the conductive layer 371. The capacitor 303 includes the conductive layer 371 and the wiring PL, and is stacked over the transistor 302.

Whereas the wiring BL is provided below the transistor 302 and the capacitor 303 in FIG. 25A, the wiring BL can be provided over the transistor 302 and the capacitor 303 as illustrated in FIG. 26A. In FIG. 26A, the transistor 302 includes a backgate BG.

Figure 26B:
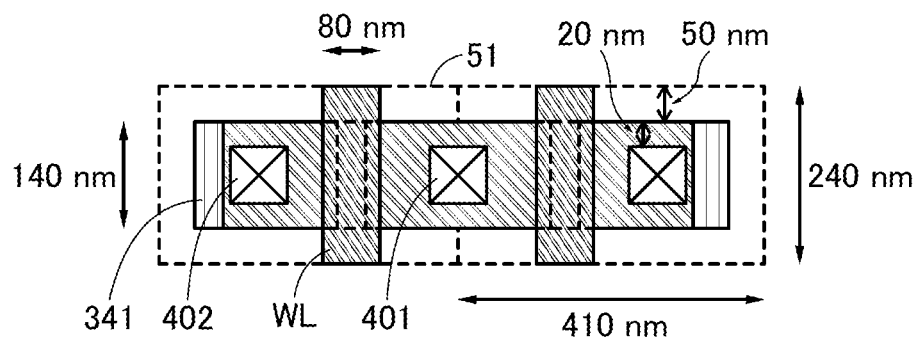

FIG. 26B is a top view of the memory cell 51 illustrated in FIG. 26A. The oxide semiconductor layer 341 is connected to the wiring BL which is provided over the transistor 302 and the capacitor 303 through the opening 401, and is connected to the conductive layer 371 of the capacitor 303 through the opening 402. Examples of dimensions of the memory cell 51 and the semiconductor layer, the conductive layer, the wiring, and the like of the memory cell 51 are shown in FIG. 26B. Here, the channel length L of the transistor is 60 nm, and the channel width W thereof is 140 nm.

The structure and method described in this embodiment can be combined as appropriate with any of the other structures and methods described in the other embodiments.

Embodiment 5

In this embodiment, a structure example of an OS transistor that can be used in one embodiment of the present invention will be described.

Structure Example 1

Figure 13A:
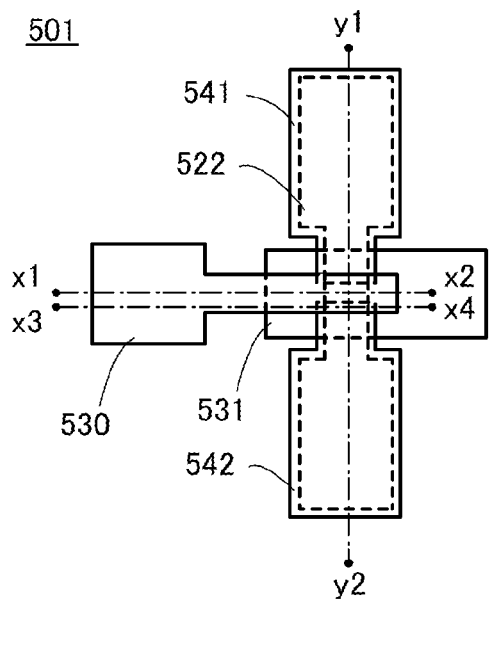
FIGS. 13A to 13D illustrate a structure example of a transistor.
Figure 13B:
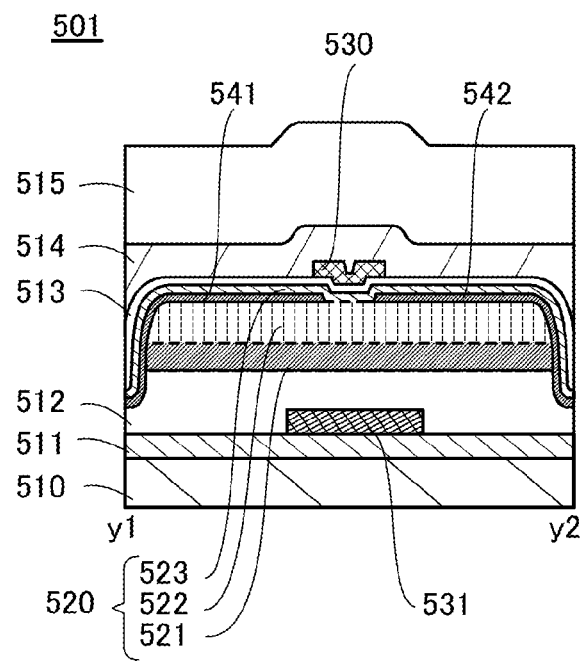
Figure 13C:
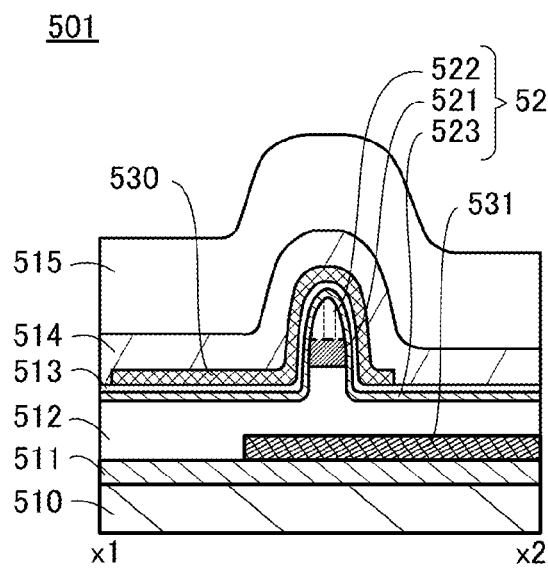
Figure 13D:
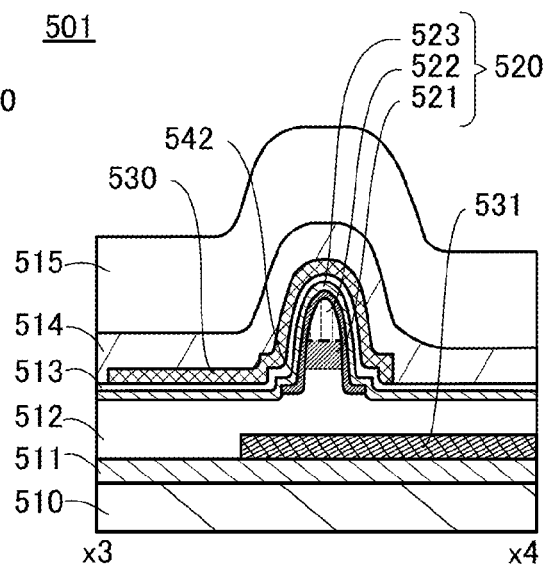

FIGS. 13A to 13D illustrate a structure example of an OS transistor. FIG. 13A is a top view illustrating a structure example of an OS transistor. FIG. 13B is a cross-sectional view taken along the line y1-y2, FIG. 13C is a cross-sectional view taken along the line x1-x2, and FIG. 13D is a cross-sectional view taken along the line x3-x4. Here, in some cases, the direction of the line y1-y2 is referred to as a channel length direction, and the direction of the line x1-x2 is referred to as a channel width direction. Accordingly, FIG. 13B illustrates a cross-sectional structure of the OS transistor in the channel length direction, and FIGS. 13C and 13D each illustrate a cross-sectional structure of the OS transistor in the channel width direction. Note that to clarify the device structure, some components are not illustrated in FIG. 13A.

An OS transistor 501 illustrated in FIGS. 13A to 13D includes a backgate. The OS transistor 501 is formed over an insulating surface, here, over an insulating layer 511. The insulating layer 511 is formed over a surface of a substrate 510. The OS transistor 501 is covered with an insulating layer 514 and an insulating layer 515. Note that the insulating layers 514 and 515 may be regarded as components of the OS transistor 501. The OS transistor 501 includes an insulating layer 512, an insulating layer 513, an oxide semiconductor layer 521, an oxide semiconductor layer 522, an oxide semiconductor layer 523, a conductive layer 530, a conductive layer 531, a conductive layer 541, and a conductive layer 542. Here, the oxide semiconductor layers 521, 522, and 523 are collectively referred to as an oxide semiconductor layer 520.

The insulating layer 513 includes a region functioning as a gate insulating layer. The conductive layer 530 functions as a gate electrode (a first gate electrode). The conductive layer 531 functions as a backgate electrode (a second gate electrode). The conductive layer 541 and the conductive layer 542 function as a source electrode and a drain electrode. Note that the conductive layer 531 is not necessarily provided (the same applies hereafter).

As illustrated in FIGS. 13B and 13C, the oxide semiconductor layer 520 includes a region where the oxide semiconductor layer 521, the oxide semiconductor layer 522, and the oxide semiconductor layer 523 are stacked in this order. The insulating layer 513 covers this stacked region. The conductive layer 530 overlaps with the stacked region of the oxide semiconductor layer with the insulating layer 513 positioned therebetween. The conductive layer 541 and the conductive layer 542 are provided over the stacked film formed of the oxide semiconductor layer 521 and the oxide semiconductor layer 522 and are in contact with a top surface of this stacked film and a side surface positioned in the channel length direction of the stacked film. As illustrated in FIGS. 13B and 13D, the conductive layers 541 and 542 are also in contact with the insulating layer 512. The oxide semiconductor layer 523 is formed to cover the oxide semiconductor layers 521 and 522 and the conductive layers 541 and 542. A bottom surface of the oxide semiconductor layer 523 is in contact with a top surface of the oxide semiconductor layer 522.

The conductive layer 530 is formed so as to surround, in the channel width direction, the region where the oxide semiconductor layers 521 to 523 are stacked in the oxide semiconductor layer 520 with the insulating layer 513 positioned therebetween (see FIG. 13C). Therefore, a gate electric field in the vertical direction and a gate electric field in the lateral direction are applied to this stacked region. In the OS transistor 501, "the gate electric field" refers to an electric field generated by voltage applied to the conductive layer 531 (gate electrode layer). Accordingly, the whole stacked region of the oxide semiconductor layers 521 to 523 can be electrically surrounded by the gate electric fields, so that a channel is formed in the whole oxide semiconductor layer 522 (bulk), in some cases. Thus, high on-state current characteristics of the OS transistor 501 can be achieved.

In this specification, a structure of a transistor in which a semiconductor is electrically surrounded by a gate electric field as in the above transistor is referred to as "a surrounded channel (s-channel) structure". The OS transistor 501 has the s-channel structure. With this s-channel structure, a large amount of current can flow between the source and the drain of the transistor, so that a high drain current in an on state (high on-state current) can be achieved.

By employing the s-channel structure in the OS transistor 501, channel formation region controllability by a gate electric field applied to the side surface of the oxide semiconductor layer 522 becomes easy. In the structure where the conductive layer 530 reaches below the oxide semiconductor layer 522 and faces the side surface of the oxide semiconductor layer 521, higher controllability can be achieved, which is preferable. Consequently, the subthreshold swing (S value) of the OS transistor 501 can be made small, so that a short-channel effect can be reduced. Thus, the s-channel structure is appropriate for miniaturization.

When an OS transistor has a three-dimensional structure like the OS transistor 501 illustrated in FIGS. 13A to 13D, the channel length can be less than 100 nm. By the miniaturization, the circuit area of the OS transistor can be made small. The channel length of the OS transistor is preferably less than 65 nm, further preferably less than or equal to 30 nm or less than or equal to 20 nm.

A conductor functioning as a gate of a transistor, a conductor functioning as a source of a transistor, and a conductor functioning as a drain of a transistor are referred to as a gate electrode, a source electrode, and a drain electrode, respectively. A region functioning as a source of a transistor and a region functioning as a drain of a transistor are referred to as a source region and a drain region, respectively. In this specification, a gate electrode might be referred to as a gate, a drain electrode or a drain region might be referred to as a drain, and a source electrode or a source region might be referred to as a source.

The channel length refers to, for example, a distance between a source and a drain in a region where a semiconductor (or a portion where a current flows in a semiconductor when a transistor is on) and a gate overlap with each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In this specification, in the case where the term "channel width" is simply used, it may denote an apparent channel width in some cases. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Structure Example 2

Figure 14A:
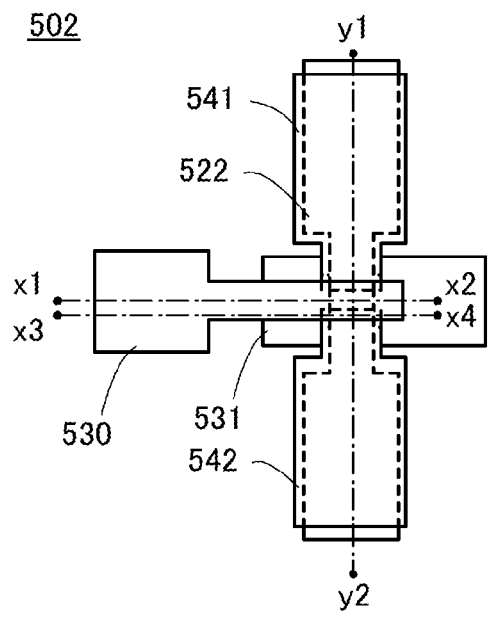
FIGS. 14A to 14D illustrate a structure example of a transistor.
Figure 14B:
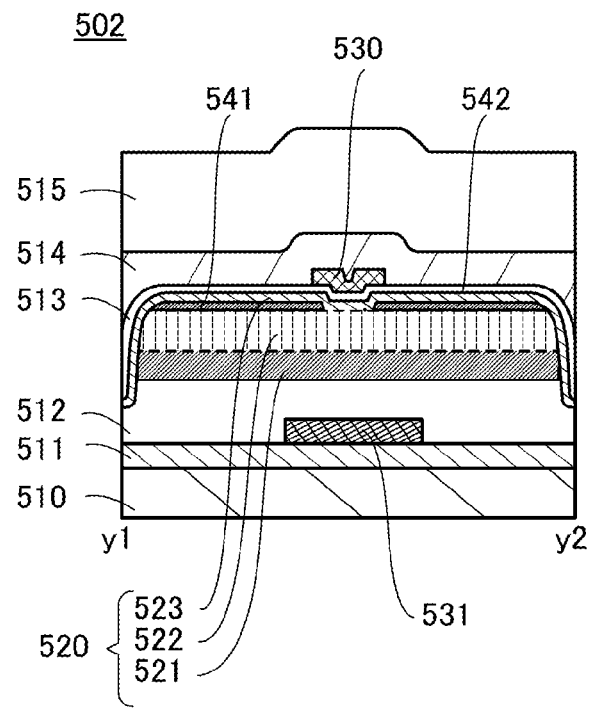
Figure 14C:
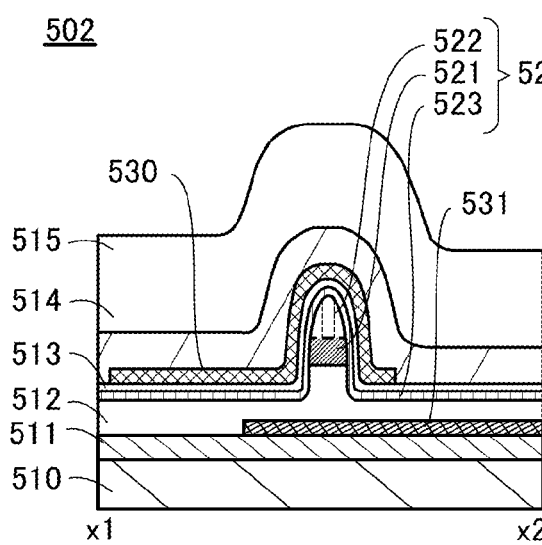
Figure 14D:
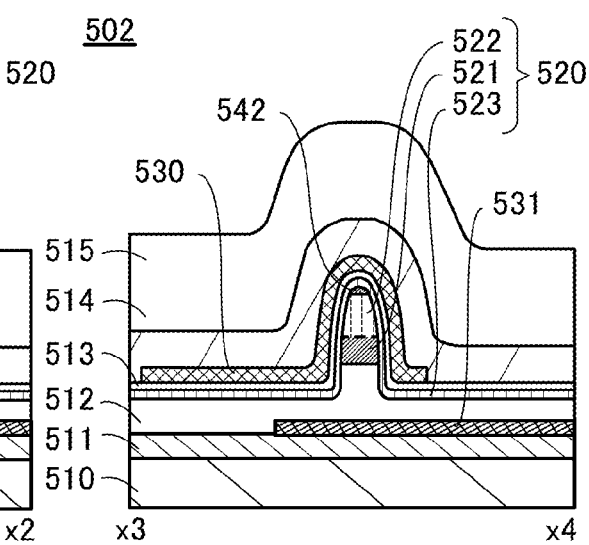
Figure 15A:
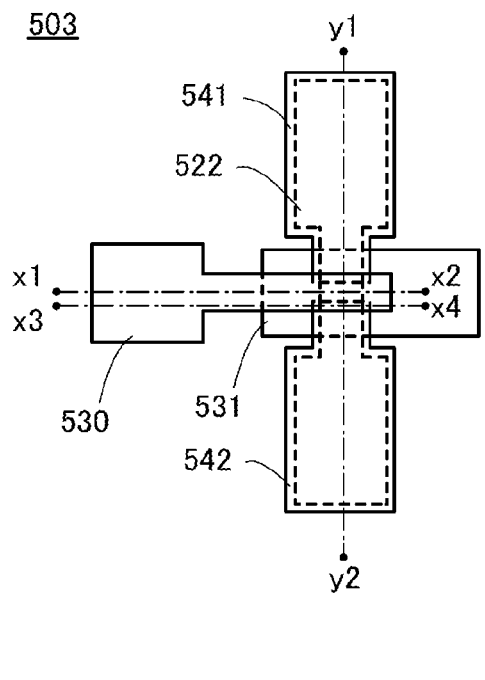
FIGS. 15A to 15D illustrate a structure example of a transistor.
Figure 15B:
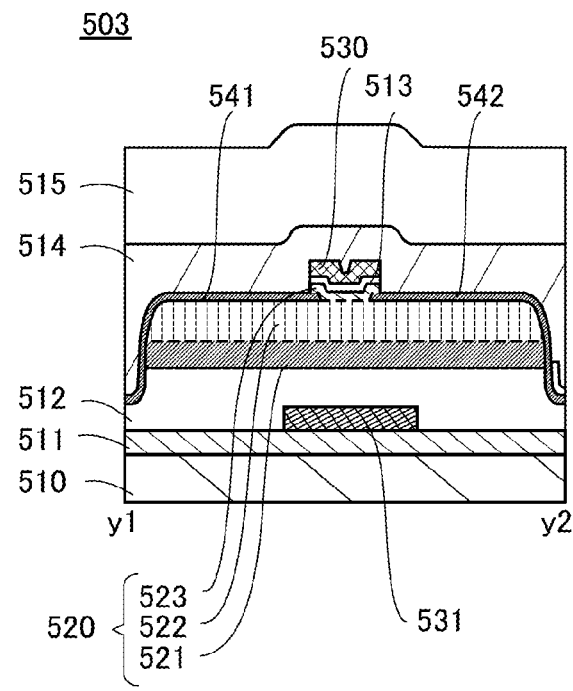
Figure 15C:
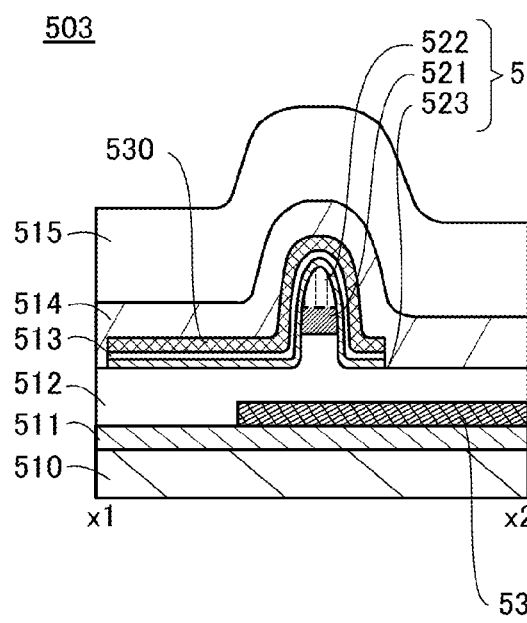
Figure 15D:
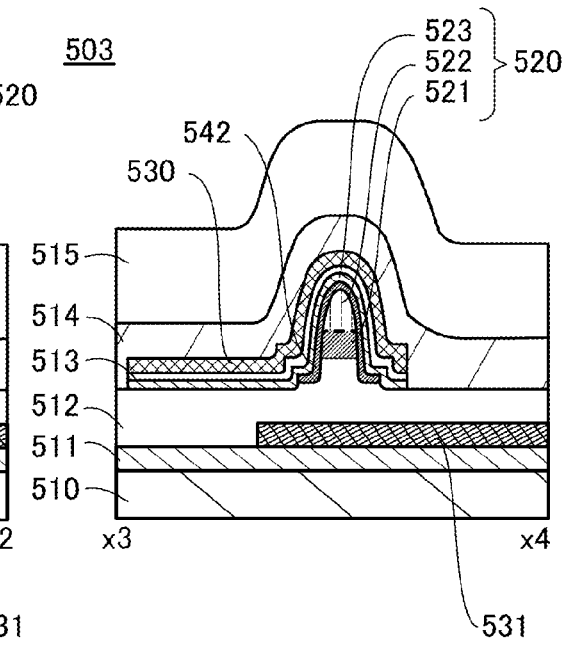
Figure 16A:
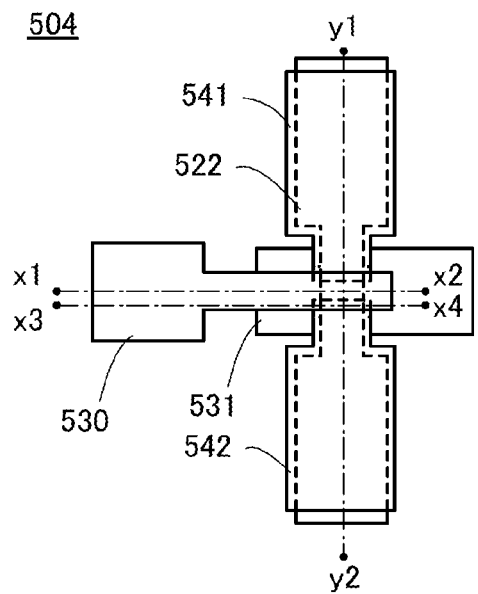
FIGS. 16A to 16D illustrate a structure example of a transistor.
Figure 16B:
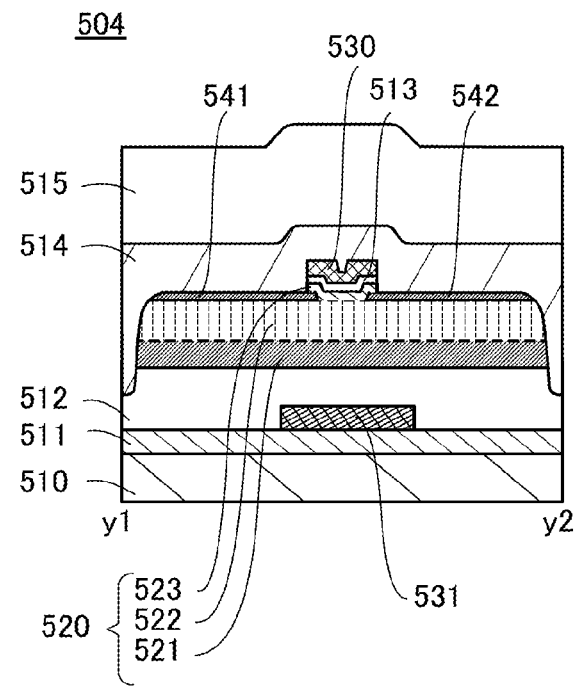
Figure 16C:
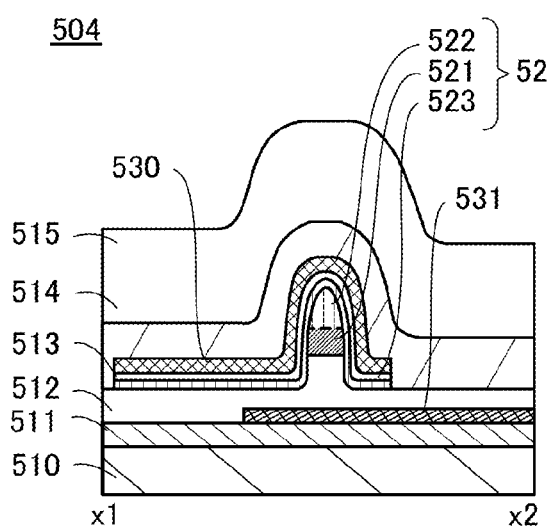
Figure 16D:
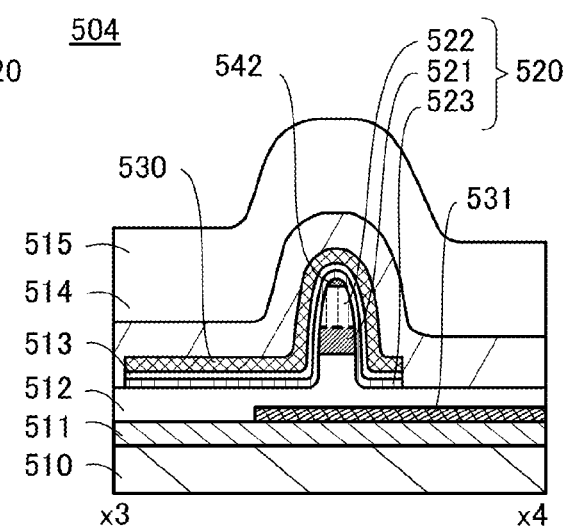
Figure 17A:
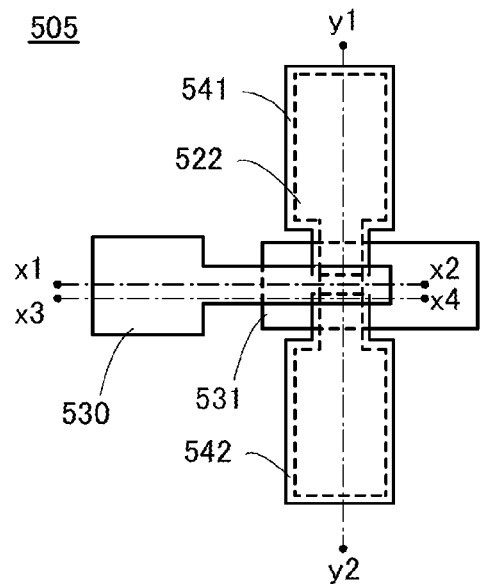
FIGS. 17A to 17D illustrate a structure example of a transistor.
Figure 17B:
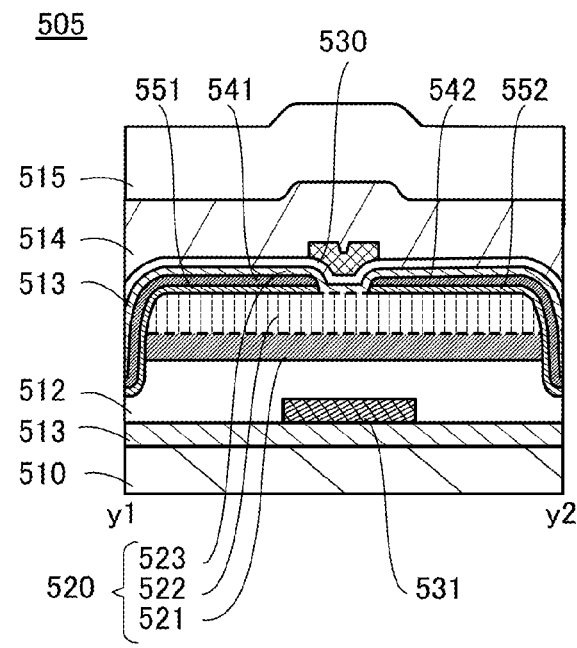
Figure 17C:
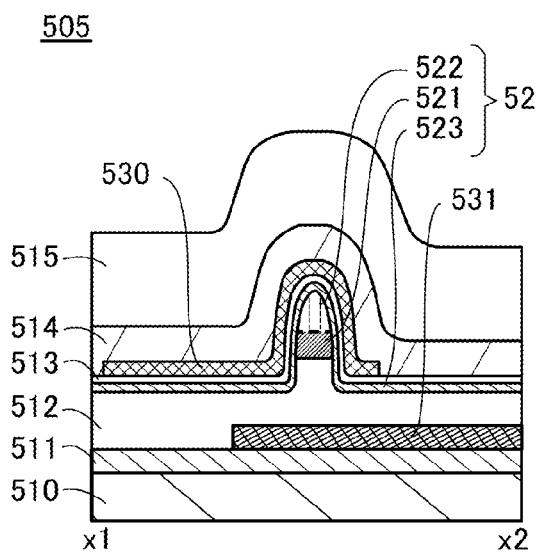
Figure 17D:
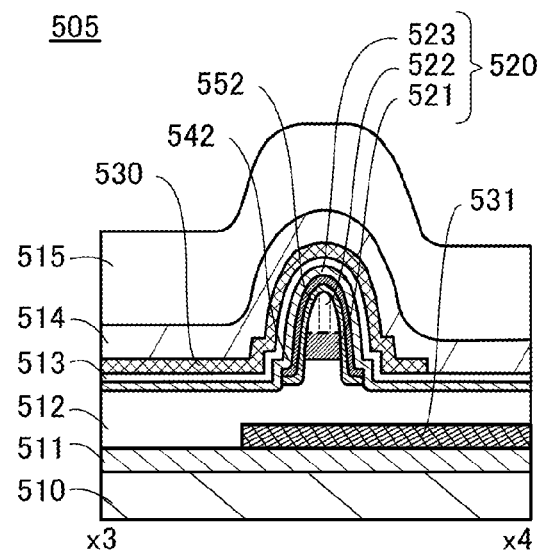
Figure 18A:
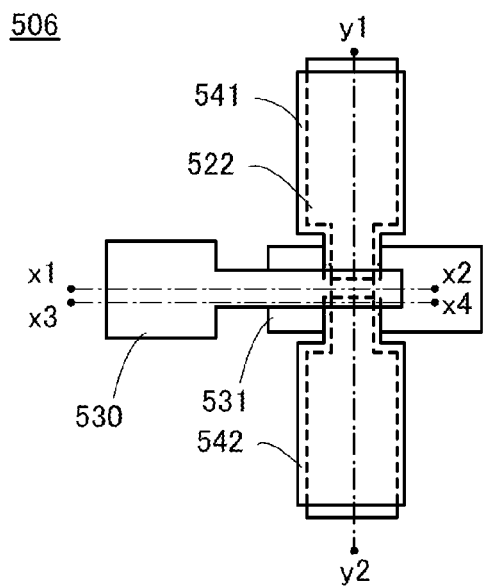
FIGS. 18A to 18D illustrate a structure example of a transistor.
Figure 18B:
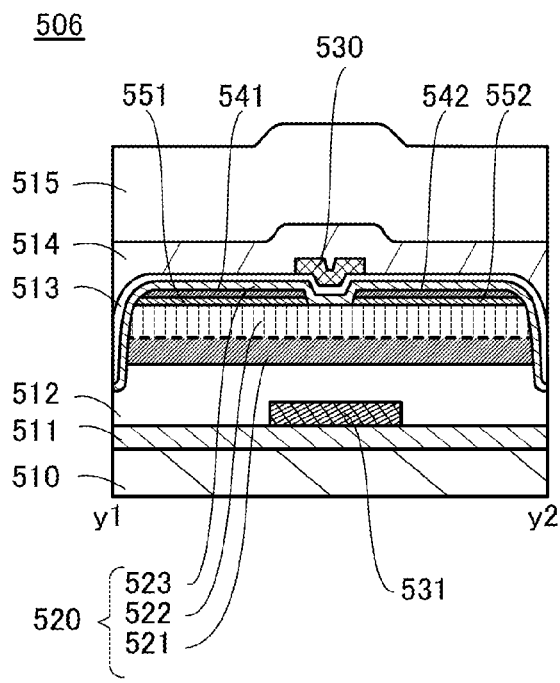
Figure 18C:
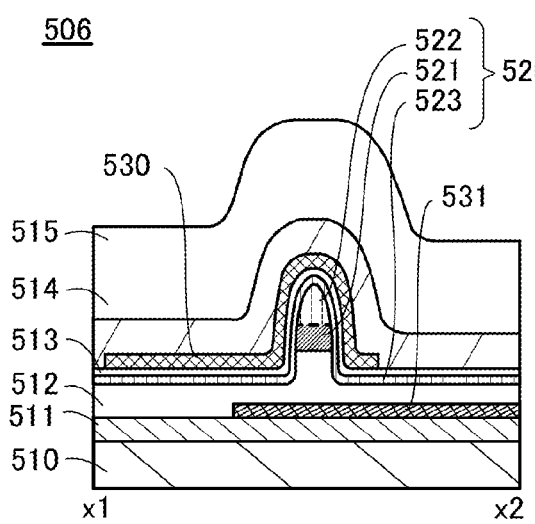
Figure 18D:
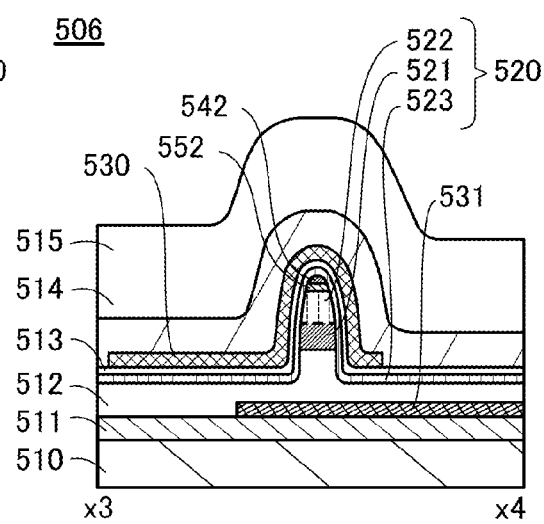

An OS transistor 502 illustrated in FIGS. 14A to 14D is a variation of the OS transistor 501. FIG. 14A is a top view of the OS transistor 502. FIG. 14B is a cross-sectional view taken along the line y1-y2, FIG. 14C is a cross-sectional view taken along the line x1-x2, and FIG. 14D is a cross-sectional view taken along the line x3-x4. Note that to clarify the device structure, some components are not illustrated in FIG. 14A.

Like the OS transistor 501, the OS transistor 502 illustrated in FIGS. 14A to 14D also has the s-channel structure. The OS transistor 502 is different from the OS transistor 501 in the shapes of the conductive layer 541 and the conductive layer 542. The conductive layer 541 and the conductive layer 542 in the OS transistor 502 are formed from a hard mask used for forming the stacked film of the oxide semiconductor layer 521 and the oxide semiconductor layer 522. Therefore, the conductive layer 541 and the conductive layer 542 are not in contact with the side surfaces of the oxide semiconductor layer 521 and the oxide semiconductor layer 522 (FIG. 14D).

Through the following steps, the oxide semiconductor layers 521 and 522 and the conductive layers 541 and 542 can be formed. A two-layer oxide semiconductor film including the oxide semiconductor layers 521 and 522 is formed. A single-layer or multi-layer conductive film is formed over the oxide semiconductor film. This conductive film is etched, so that a hard mask is formed. Using this hard mask, the two-layer oxide semiconductor film is etched to form the oxide semiconductor layers 521 and 522. Then, the hard mask is etched to form the conductive layer 541 and the conductive layer 542.

Structure Examples 3 and 4

An OS transistor 503 illustrated in FIGS. 15A to 15D is a variation of the OS transistor 501, and an OS transistor 504 illustrated in FIGS. 16A to 16D is a variation of the OS transistor 502. In each of the OS transistors 503 and 504, the oxide semiconductor layer 523 and the insulating layer 513 are etched using the conductive layer 530 as a mask. Thus, an edge of the oxide semiconductor layer 523 and an edge of the insulating layer 513 are substantially aligned with an edge of the conductive layer 530.

Structure Examples 5 and 6

An OS transistor 505 illustrated in FIGS. 17A to 17D is a variation of the OS transistor 501, and an OS transistor 506 illustrated in FIGS. 18A to 18D is a variation of the OS transistor 502. The OS transistors 505 and 506 each include a layer 551 between the oxide semiconductor layer 523 and the conductive layer 541 and a layer 552 between the oxide semiconductor layer 523 and the conductive layer 542.

The layers 551 and 552 can each be formed using a layer of a transparent conductor, an oxide semiconductor, a nitride semiconductor, or an oxynitride semiconductor, for example. The layers 551 and 552 can each be formed using an n-type oxide semiconductor layer or a conductive layer which has a higher resistance than the conductive layers 541 and 542. The layers 551 and 552 may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, or the like. Any of these layers may contain one or more of hydrogen, carbon, nitrogen, silicon, germanium, and argon.

The layers 551 and 552 may have a property of transmitting visible light. Alternatively, the layers 551 and 552 may have a property of not transmitting visible light, ultraviolet light, infrared light, or X-rays by reflecting or absorbing it. In some cases, such a property can suppress a change in electrical characteristics of the transistor due to stray light.

As each of the layers 551 and 552, a layer which does not form a Schottky barrier with the oxide semiconductor layer 523 is preferably used. Thus, on-state characteristics of the OS transistors 505 and 506 can be improved.

The layers 551 and 552 are each preferably a layer that has a higher resistance than the conductive layers 541 and 542. The layers 551 and 552 each preferably have resistance lower than the channel resistance of the transistor. For example, the layers 551 and 552 may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 551 and 552 having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the layers 551 and 552 (e.g., the layer on the drain side) may preferably be provided.

Structure Example 7

In FIGS. 13A to 13D, FIGS. 14A to 14D, FIGS. 15A to 15D, FIGS. 16A to 16D, FIGS. 17A to 17D, and FIGS. 18A to 18D, the conductive layer 530 functioning as the first gate electrode and the conductive layer 531 functioning as the second gate electrode may be connected to each other. FIGS. 22A to 22D show an example in which the conductive layer 530 and the conductive layer 531 in FIGS. 13A to 13D are connected to each other.

Figure 22A:
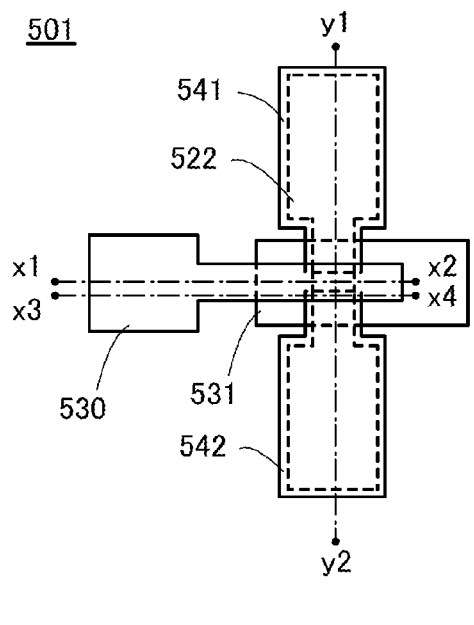
FIGS. 22A to 22D illustrate a structure example of a transistor.
Figure 22B:
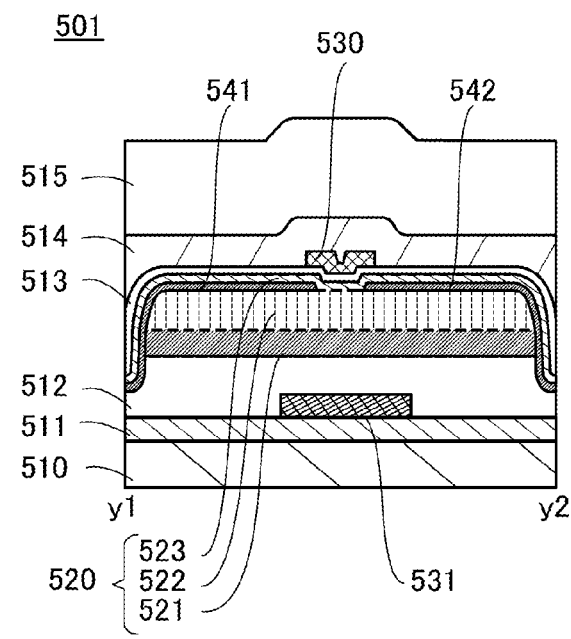
Figure 22C:
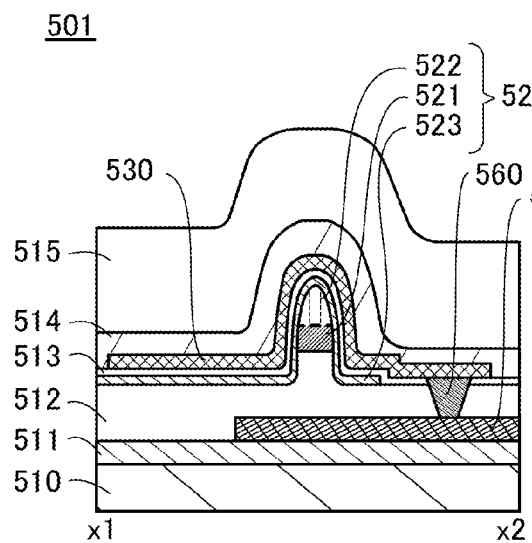
Figure 22D:
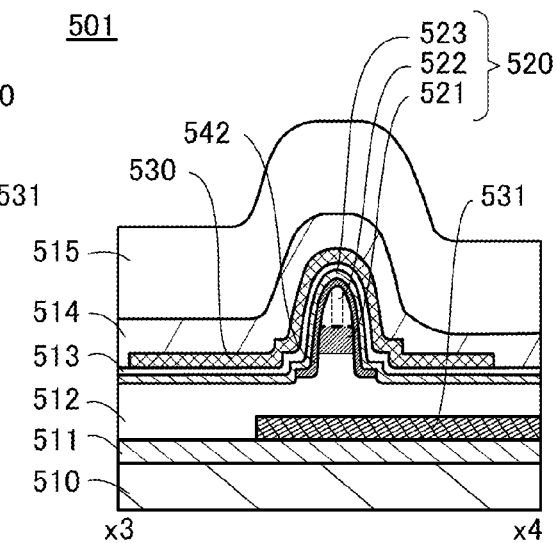

As illustrated in FIG. 22C, an opening is provided in the insulating layer 512 and the insulating layer 513, and a conductive layer 560 is provided in the opening. The conductive layer 530 is connected to the conductive layer 531 through the conductive layer 560. Accordingly, the first gate electrode and the second gate electrode of the transistor 501 can be connected to each other. A structure in which the first gate electrode and the second gate electrode are connected to each other can also be employed in FIGS. 14A to 14D, FIGS. 15A to 15D, FIGS. 16A to 16D, FIGS. 17A to 17D, and FIGS. 18A to 18D.

The components of the OS transistors 501 to 506 will be described below.

<Oxide Semiconductor Layer>

As the semiconductor material of the oxide semiconductor layers 521 to 523, typically, an In—Ga oxide, an In—Zn oxide, or an In-M-Zn oxide (M is Ga, Y, Zr, La, Ce, or Nd) is used. In addition, the oxide semiconductor layers 521 to 523 are not limited to the oxide layers containing indium. The oxide semiconductor layers 521 to 523 can be a Zn—Sn oxide layer, a Ga—Sn oxide layer, or a Zn—Mg oxide layer, for example. The oxide semiconductor layer 522 is preferably formed using an In-M-Zn oxide. Each of the oxide semiconductor layers 521 and 523 is preferably formed using a Ga oxide.

The case where the oxide semiconductor layers 521 to 523 are formed using In-M-Zn oxide films formed by a sputtering method is described. The atomic ratio of metal elements of a target for the deposition of an In-M-Zn oxide that is used for forming the oxide semiconductor layer 522 is In:M:Zn=$x_1$:$y_1$:$z_1$. The atomic ratio of metal elements of a target that is used for forming the oxide semiconductor layer 521 and the oxide semiconductor layer 523 is In:M:Zn=$x_2$:$y_2$:$z_2$.

For forming the oxide semiconductor layer 522, a polycrystalline target of an In-M-Zn oxide in which $x_1/y_1$ is greater than or equal to 1/3 and less than or equal to 6, or greater than or equal to 1 and less than or equal to 6, and $z_1/y_1$ is greater than or equal to 1/3 and less than or equal to 6, or greater than or equal to 1 and less than or equal to 6 is preferably used. Note that when $z_1/y_1$ is greater than or equal to 1 and less than or equal to 6, a CAAC-OS film is easily formed. Typical examples of the atomic ratio of the metal elements in the target include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and In:M:Zn=4:2:4.1. Note that the CAAC-OS is an oxide semiconductor including a c-axis aligned crystal part, and is described later. It is preferable that the CAAC-OS film have no spinel crystal structure in particular. Thus, the reliability and electrical characteristics of the transistor including the CAAC-OS film can be improved.

In the target used for forming the oxide semiconductor layers 521 and 523, $x_2/y_2$ is preferably less than $x_1/y_1$, and $z_2/y_2$ is preferably greater than or equal to 1/3 and less than or equal to 6, further preferably greater than or equal to 1 and less than or equal to 6. Note that when $z_2/y_2$ is greater than or equal to 1 and less than or equal to 6, a CAAC-OS film is easily formed. Typical examples of the atomic ratio of the metal elements in the target include In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

In the In-M-Zn oxide film, the proportions of atoms in the atomic ratio vary within a range of ±40% as an error. For example, the atomic ratio of metal elements contained in an oxide semiconductor film deposited using an oxide target of In:M:Zn=4:2:4.1 is approximately In:M:Zn=4:2:3.

[Energy Band]

Figure 19A:
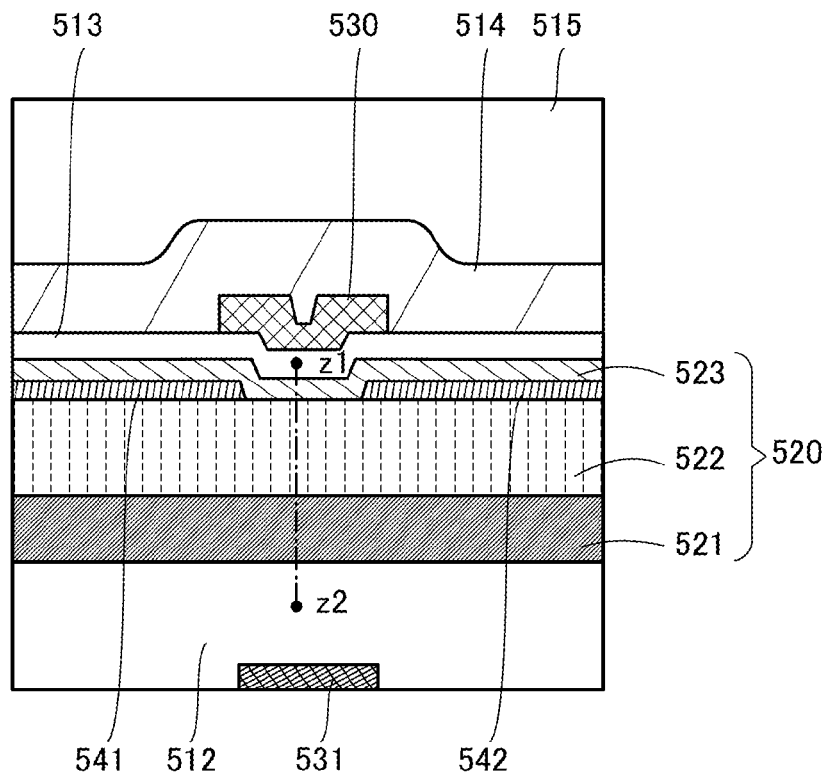
FIG. 19A is an enlarged view of a portion in FIG. 14B.
Figure 19B:
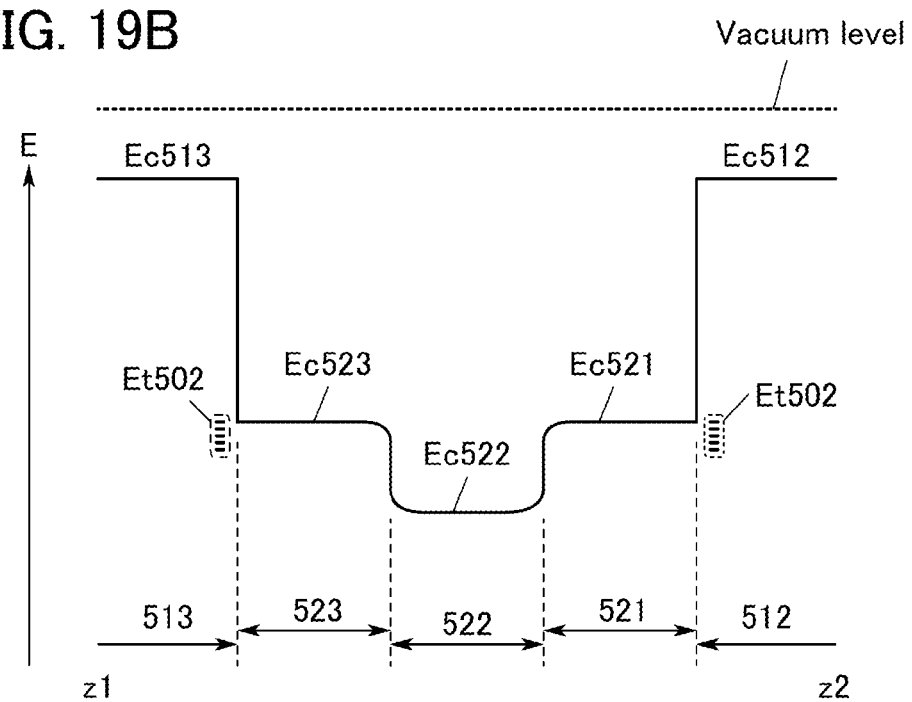
FIG. 19B is an energy band diagram of a transistor.

Next, a function and an effect of the oxide semiconductor layer 520 in which the oxide semiconductor layers 521, 522, and 523 are stacked are described using an energy band diagram in FIG. 19B. FIG. 19A is an enlarged view of a channel region of the OS transistor 502 illustrated in FIG. 14B. FIG. 19B shows an energy band diagram of a portion taken along the dotted line z1-z2 (the channel formation region of the OS transistor 502) in FIG. 19A. The OS transistor 502 is described below as an example, but the same can apply to the OS transistor 501 and the OS transistors 503 to 506.

In FIG. 19B, Ec512, Ec521, Ec522, Ec523, and Ec513 indicate the energy of the conduction band minimum of the insulating layer 512, the oxide semiconductor layer 521, the oxide semiconductor layer 522, the oxide semiconductor layer 523, and the insulating layer 513, respectively.

Here, a difference in energy between the vacuum level and the conduction band minimum (the difference is also referred to as "electron affinity") corresponds to a value obtained by subtracting an energy gap from a difference in energy between the vacuum level and the valence band maximum (the difference is also referred to as an ionization potential). Note that the energy gap can be measured using a spectroscopic ellipsometer (UT-300 manufactured by HORIBA JOBIN YVON S.A.S.). The energy difference between the vacuum level and the valence band maximum can be measured using an ultraviolet photoelectron spectroscopy (UPS) device (VersaProbe manufactured by ULVAC-PHI, Inc.).

Note that an In—Ga—Zn oxide which is formed using a sputtering target having an atomic ratio of In:Ga:Zn=1:3:2 has an energy gap of approximately 3.5 eV and an electron affinity of approximately 4.5 eV. An In—Ga—Zn oxide which is formed using a sputtering target having an atomic ratio of In:Ga:Zn=1:3:4 has an energy gap of approximately 3.4 eV and an electron affinity of approximately 4.5 eV. An In—Ga—Zn oxide which is formed using a sputtering target having an atomic ratio of In:Ga:Zn=1:3:6 has an energy gap of approximately 3.3 eV and an electron affinity of approximately 4.5 eV. An In—Ga—Zn oxide which is formed using a sputtering target having an atomic ratio of In:Ga:Zn=1:6:2 has an energy gap of approximately 3.9 eV and an electron affinity of approximately 4.3 eV. An In—Ga—Zn oxide which is formed using a sputtering target having an atomic ratio of In:Ga:Zn=1:6:8 has an energy gap of approximately 3.5 eV and an electron affinity of approximately 4.4 eV. An In—Ga—Zn oxide which is formed using a sputtering target having an atomic ratio of In:Ga:Zn=1:6:10 has an energy gap of approximately 3.5 eV and an electron affinity of approximately 4.5 eV. An In—Ga—Zn oxide which is formed using a sputtering target having an atomic ratio of In:Ga:Zn=1:1:1 has an energy gap of approximately 3.2 eV and an electron affinity of approximately 4.7 eV. An In—Ga—Zn oxide which is formed using a sputtering target having an atomic ratio of In:Ga:Zn=3:1:2 has an energy gap of approximately 2.8 eV and an electron affinity of approximately 5.0 eV.

Since the insulating layer 512 and the insulating layer 513 are insulators, Ec512 and Ec513 are closer to the vacuum level than Ec521, Ec522, and Ec523 (i.e., the insulating layer 512 and the insulating layer 513 have a smaller electron affinity than the oxide semiconductor layers 521, 522, and 523).

Ec521 is closer to the vacuum level than Ec522. Specifically, Ec521 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Ec523 is closer to the vacuum level than Ec522. Specifically, Ec523 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Mixed regions are formed in the vicinity of the interface between the oxide semiconductor layer 521 and the oxide semiconductor layer 522 and the interface between the oxide semiconductor layer 522 and the oxide semiconductor layer 523; thus, the energy at the bottom of the conduction band changes continuously. In other words, no state or few states exist at these interfaces.

Accordingly, electrons transfer mainly through the oxide semiconductor layer 522 in the stacked-layer structure having the above energy band structure. Therefore, even if an interface state exists at the interface between the oxide semiconductor layer 521 and the insulating layer 512 or the interface between the oxide semiconductor layer 523 and the insulating layer 513, the interface state hardly influences the transfer of electrons. In addition, since no interface state or few interface states exist at the interface between the oxide semiconductor layer 521 and the oxide semiconductor layer 522 and the interface between the oxide semiconductor layer 523 and the oxide semiconductor layer 522, the transfer of electrons is not interrupted in the region. Consequently, the OS transistor 502 including the above stacked oxide semiconductors can have high field-effect mobility.

Although trap states Et502 due to impurities or defects might be formed in the vicinity of the interface between the oxide semiconductor layer 521 and the insulating layer 512 and the interface between the oxide semiconductor layer 523 and the insulating layer 513 as illustrated in FIG. 19B, the oxide semiconductor layer 522 can be separated from the trap states owing to the existence of the oxide semiconductor layers 521 and 523.

In the OS transistor 502, in the channel width direction, the top surface and side surfaces of the oxide semiconductor layer 522 are in contact with the oxide semiconductor layer 523, and the bottom surface of the oxide semiconductor layer 522 is in contact with the oxide semiconductor layer 521 (see FIG. 14C). Surrounding the oxide semiconductor layer 522 by the oxide semiconductor layers 521 and 523 in this manner can further reduce the influence of the trap states.

However, when the energy difference between Ec522 and Ec521 or Ec523 is small, an electron in the oxide semiconductor layer 522 might reach the trap state by passing over the energy difference. Since the electron is trapped at the trap state, a negative fixed charge is generated at the interface with the insulating film, causing the threshold voltage of the transistor to be shifted in the positive direction.

Therefore, each of the energy gaps between Ec521 and Ec522 and between Ec522 and Ec523 is preferably 0.1 eV or more, or further preferably 0.15 eV or more, in which case a change in the threshold voltage of the transistor can be reduced and the transistor can have favorable electrical characteristics.

The band gap of each of the oxide semiconductor layers 521 and 523 is preferably wider than that of the oxide semiconductor layer 522.

For the oxide semiconductor layers 521 and 523, a material containing Ga Y, Zr, La, Ce, or Nd with a higher atomic ratio than that used for the oxide semiconductor layer 522 can be used, for example. Specifically, any of the above metal elements with an atomic ratio 1.5 times or more, preferably 2 times or more, or further preferably 3 times or more as high as the metal element in the oxide semiconductor layer 522 is contained. Any of the above metal elements is strongly bonded to oxygen and thus has a function of suppressing generation of an oxygen vacancy in the oxide semiconductor. That is, an oxygen vacancy is less likely to be generated in the oxide semiconductor layers 521 and 523 than in the oxide semiconductor layer 522.

When the oxide semiconductor layers 521, 522, and 523 are In-M-Zn oxides containing at least indium, zinc, and M (M is Ga, Y, Zr, La, Ce, or Nd) and the atomic ratio of In to M and Zn of the oxide semiconductor layer 521 is $x_1:y_1:z_1$, that of the oxide semiconductor layer 522 is $x_2:y_2:z_2$, and that of the oxide semiconductor layer 523 is $x_3:y_3:z_3$, $y_1/x_1$ and $y_3/x_3$ are preferably larger than $y_2/x_2$. Furthermore, $y_1/x_1$ and $y_3/x_3$ are 1.5 times or more as large as $y_2/x_2$, preferably 2 times or more as large as $y_2/x_2$, or further preferably 3 times or more as large as $y_2/x_2$. In this case, the transistor can have stable electrical characteristics when $y_2$ is greater than or equal to $x_2$ in the oxide semiconductor layer 522. However, when $y_2$ is three times or more as large as $x_2$, the field-effect mobility of the transistor is reduced; accordingly, $y_2$ is preferably smaller than 3 times $x_2$.

An In-M-Zn oxide film satisfying the above conditions can be formed using an In-M-Zn oxide target satisfying the above atomic ratio of metal elements.

In the case where Zn and O are not taken into consideration, the proportion of In and the proportion of M in the oxide semiconductor layer 521 and the oxide semiconductor layer 523 are preferably less than 50 atomic % and greater than 50 atomic %, respectively, or further preferably less than 25 atomic % and greater than 75 atomic %, respectively. In the case where Zn and O are not taken into consideration, the proportion of In and the proportion of M in the oxide semiconductor layer 522 are preferably greater than 25 atomic % and less than 75 atomic %, respectively, or further preferably greater than 34 atomic % and less than 66 atomic %, respectively.

Furthermore, at least one of the oxide semiconductor layers 521 and 523 does not necessarily contain indium in some cases. For example, the oxide semiconductor layer 521 and/or the oxide semiconductor layer 523 can be formed using a gallium oxide film.

The thickness of each of the oxide semiconductor layers 521 and 523 is greater than or equal to 3 nm and less than or equal to 100 nm, or preferably greater than or equal to 3 nm and less than or equal to 50 nm. The thickness of the oxide semiconductor layer 522 is greater than or equal to 3 nm and less than or equal to 200 nm, preferably greater than or equal to 3 nm and less than or equal to 100 nm, or further preferably greater than or equal to 3 nm and less than or equal to 50 nm. The oxide semiconductor layer 523 is preferably thinner than the oxide semiconductor layers 521 and 522.

Note that in order that an OS transistor in which a channel is formed in an oxide semiconductor have stable electrical characteristics, it is effective to make the oxide semiconductor intrinsic or substantially intrinsic by reducing the concentration of impurities in the oxide semiconductor. The term "substantially intrinsic" refers to the state where an oxide semiconductor has a carrier density lower than $1\times10^{17}/cm^3$, preferably lower than $1\times10^{15}/cm^3$, or further preferably lower than $1\times10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity level becomes a trap, which might deteriorate the electrical characteristics of the transistor. Therefore, it is preferable to reduce the concentration of the impurities in the oxide semiconductor layers 521, 522, and 523 and at interfaces between the oxide semiconductor layers.

In order to make the oxide semiconductor intrinsic or substantially intrinsic, for example, the concentration of silicon at a certain depth of the oxide semiconductor or in a region of the oxide semiconductor, which is measured by SIMS, is lower than $1\times10^{19}$ atoms/cm$^3$, preferably lower than $5\times10^{18}$ atoms/cm$^3$, or further preferably lower than $1\times10^{18}$ atoms/cm$^3$. The concentration of hydrogen at a certain depth of the oxide semiconductor or in a certain region of the oxide semiconductor is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, or still further preferably lower than or equal to $5\times10^{18}$ atoms/cm$^3$. The concentration of nitrogen at a certain depth of the oxide semiconductor or in a certain region of the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, or still further preferably lower than or equal to $5\times10^{17}$ atoms/cm$^3$.

In addition, in the case where the oxide semiconductor includes a crystal, the crystallinity of the oxide semiconductor might be decreased if silicon or carbon is included at high concentration. In order not to lower the crystallinity of the oxide semiconductor, for example, the concentration of silicon at a certain depth of the oxide semiconductor or in a certain region of the oxide semiconductor is lower than $1\times10^{19}$ atoms/cm$^3$, preferably lower than $5\times10^{18}$ atoms/cm$^3$, or further preferably lower than $1\times10^{18}$ atoms/cm$^3$. Furthermore, the concentration of carbon at a certain depth of the oxide semiconductor or in a certain region of the oxide semiconductor is lower than $1\times10^{19}$ atoms/cm$^3$, preferably lower than $5\times10^{18}$ atoms/cm$^3$, or further preferably lower than $1\times10^{18}$ atoms/cm$^3$, for example.

A transistor in which a highly purified oxide semiconductor is used for a channel formation region as described above has an extremely low off-state current. In the case where the voltage between a source and a drain is set at approximately 0.1 V, 5 V, or 10 V, for example, the off-state current standardized on the channel width of the transistor can be as low as several yoctoamperes per micrometer to several zeptoamperes per micrometer.

[Off-State Current]

Unless otherwise specified, the off-state current in this specification refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to off-state current at given Vgs, off-state current at Vgs in a given range, or off-state current at Vgs at which sufficiently low off-state current is obtained.

As an example, the assumption is made of an n-channel transistor where the threshold voltage Vth is 0.5 V and the drain current is $1 \times 10^{-9}$ A at Vgs of 0.5 V, $1 \times 10^{-13}$ A at Vgs of 0.1 V, $1 \times 10^{-19}$ A at Vgs of −0.5 V, and $1 \times 10^{-22}$ A at Vgs of −0.8 V. The drain current of the transistor is $1 \times 10^{-19}$ A or lower at Vgs of −0.5 V or at Vgs in the range of −0.8 V to −0.5 V; therefore, it can be said that the off-state current of the transistor is $1 \times 10^{-19}$ A or lower. Since there is Vgs at which the drain current of the transistor is $1 \times 10^{-22}$ A or lower, it may be said that the off-state current of the transistor is $1 \times 10^{-22}$ A or lower.

In this specification, the off-state current of a transistor with a channel width W is sometimes represented by a current value in relation to the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage Vds between its drain and source in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

[Crystal Structure of Oxide Semiconductor Film]

A structure of an oxide semiconductor film that forms the oxide semiconductor layer 520 will be described. In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

<CAAC-OS Film>

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

While in the high-resolution planar TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that in structural analysis of the CAAC-OS film including an $InGaZnO_4$ crystal by an out-of-plane method, another peak may appear when 2θ is around 36°, in addition to the peak at 2θ of around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film with a low impurity concentration. The impurity is an element other than the main components of the oxide semiconductor film, such as hydrogen, carbon, silicon, or a transition metal element. An element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity. Additionally, the impurity contained in the oxide semiconductor film might serve as a carrier trap or a carrier generation source.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus has a low carrier density in some cases. Thus, a transistor including the oxide semiconductor film rarely has a negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. An electric charge trapped by the carrier traps in the oxide semiconductor film takes a long time to be released. The trapped electric charge may behave like a fixed electric charge. Thus, the transistor which includes the oxide semiconductor film having a high impurity concentration and a high density of defect states might have unstable electrical characteristics.

In an OS transistor using the CAAC-OS film, change in electric characteristics of the transistor due to irradiation with visible light or ultraviolet light is small.

<Microcrystalline Oxide Semiconductor Film>

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS, for example, a grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is analyzed by an out-of-plane method using an X-ray beam having a diameter larger than the size of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS film when an electron beam having a probe diameter close to or smaller than the size of a crystal part is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

<Amorphous Oxide Semiconductor Film>

The amorphous oxide semiconductor film is an oxide semiconductor film having disordered atomic arrangement and no crystal part. For example, the amorphous oxide semiconductor film does not have a specific state as in quartz.

In a high-resolution TEM image of the amorphous oxide semiconductor film, crystal parts cannot be found. When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

An oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In this manner, growth of the crystal part occurs due to the crystallization of the a-like OS film, which is induced by a slight amount of electron beam employed in the TEM observation. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image.

The film density of the oxide semiconductor film varies depending on the structure in some cases. For example, the structure of an oxide semiconductor film can be estimated by comparing the film density of the oxide semiconductor film with the film density of a single crystal oxide semiconductor film having the same composition as the oxide semiconductor film. For example, the film density of the a-like OS film is higher than or equal to 78.6% and lower than 92.3% of the film density of the single crystal oxide semiconductor film having the same composition. For example, the film density of the nc-OS film and the CAAC-OS film is higher than or equal to 92.3% or and lower than 100% of the film density of the single crystal oxide semiconductor film having the same composition. Note that it is difficult to form an oxide semiconductor film having a film density of lower than 78% of the film density of the single crystal oxide semiconductor film having the same composition.

Specific examples of the above description are given. For example, in the case of an oxide semiconductor film having an atomic ratio of In:Ga:Zn=1:1:1, the film density of single crystal $InGaZnO_4$ with a rhombohedral crystal structure is 6.357 $g/cm^3$. Accordingly, in the case of the oxide semiconductor film having an atomic ratio of In:Ga:Zn=1:1:1, the film density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the film density of each of the nc-OS film and the CAAC-OS film is higher than or equal to 5.9 $g/cm^3$ and lower than 6.3 $g/cm^3$.

Note that there is a possibility that an oxide semiconductor film having a certain composition cannot exist in a single crystal structure. In that case, single crystal oxide semiconductor films with different compositions are combined in an adequate ratio to calculate the density equivalent to that of a single crystal oxide semiconductor film with the desired composition. The film density of the single crystal oxide semiconductor film having the desired composition can be calculated using a weighted average according to the combination ratio of the single crystal oxide semiconductor films with different compositions. Note that it is preferable to combine as few kinds of single crystal oxide semiconductor films as possible for film density calculation.

Note that an oxide semiconductor film may be a stacked film including two or more of an amorphous oxide semiconductor film, an a-like OS film, a microcrystalline oxide semiconductor film, and a CAAC-OS film, for example.

<Substrate>

The substrate 510 is not limited to a simple supporting substrate and may be a substrate where a device such as a transistor is formed. In that case, one of the conductive layers 530, 541, and 542 of the OS transistor 501 may be electrically connected to the device.

<Base Insulating Film>

The insulating layer 511 has a function of preventing impurity diffusion from the substrate 510. The insulating layer 512 preferably has a function of supplying oxygen to the oxide semiconductor layer 520. For this reason, the insulating layer 512 is preferably an insulating film containing oxygen, further preferably, an insulating film containing oxygen in which the oxygen content is higher than that in the stoichiometric composition. For example, a film from which oxygen molecules at more than or equal to $1.0 \times 10^{18}$ molecules/$cm^3$ are released in thermal desorption spectroscopy (TDS) at a surface temperature of the film of higher than or equal to 100° C. and lower than or equal to 700° C., or higher than or equal to 100° C. and lower than or equal to 500° C. can be used. When the substrate 510 is a substrate where a device is formed as described above, the insulating layer 511 is preferably subjected to planarization treatment such as chemical mechanical polishing (CMP) treatment so as to have a flat surface.

The insulating layers 511 and 512 can be formed using an insulating material of aluminum oxide, aluminum oxynitride, magnesium oxide, silicon oxide, silicon oxynitride, gallium oxide, germanium oxide, yttrium oxide, zirconium oxide, lanthanum oxide, neodymium oxide, hafnium oxide, tantalum oxide, silicon nitride, silicon nitride oxide, aluminum nitride oxide, or the like, or a mixed material of these materials. In this specification, oxynitride refers to a material which includes more oxygen than nitrogen, and nitride oxide refers to a substance which includes more nitrogen than oxygen.

<Gate Electrode>

The conductive layer 530 is preferably formed using a single low-resistant material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), iridium (Ir), strontium (Sr), and platinum (Pt); an alloy of any of these materials; or a compound containing any of these materials as its main component.

The conductive layer 530 may have a single-layer structure or a stacked-layer structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The conductive layer 530 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Here, when a transistor T has a pair of gates between which a semiconductor film is interposed as in the case of the transistors 501 to 506, a signal A may be applied to one gate and a fixed potential Vb may be applied to the other gate.

The signal A is, for example, a signal for controlling the on/off state. The signal A may be a digital signal with two kinds of potentials, V1 and V2 (V1>V2). For example, the potential V1 may be a high power supply potential and the potential V2 may be a low power supply potential. The signal A may be an analog signal.

The fixed potential Vb is, for example, a potential for controlling a threshold voltage VthA of the transistor T. The fixed potential Vb is preferably the potential V1 or the potential V2, in which case a potential generation circuit for generating the fixed potential Vb does not need to be provided additionally. The fixed potential Vb may be a potential different from the potential V1 or the potential V2. When the fixed potential Vb is low, the threshold voltage VthA can be increased in some cases. As a result, drain current generated when gate-source voltage Vgs is 0 V can be reduced and leakage current in the circuit including the transistor T can be reduced in some cases. The fixed potential Vb may be, for example, lower than the low power supply potential. When the fixed potential Vb is high, the threshold voltage VthA can be decreased in some cases. As a result, drain current generated when the gate-source voltage Vgs is VDD can be increased and the operating speed of the circuit including the transistor T can be improved in some cases. The fixed potential Vb may be, for example, higher than the low power supply potential.

The signal A may be applied to one gate and a signal B may be applied to the other gate of the transistor T. The signal B is, for example, a signal for controlling the on/off state of the transistor T. The signal B may be a digital signal with two kinds of potentials, V3 and V4 (V3>V4). For example, the potential V3 may be a high power source potential and the potential V4 may be a low power source potential. The signal B may be an analog signal.

When both the signal A and the signal B are digital signals, the signal B may have the same digital value as the signal A. In that case, the on-state current of the transistor T and the operating speed of the circuit including the transistor T can be increased in some cases. Here, the potential V1 of the signal A may be different from the potential V3 of the signal B. Furthermore, the potential V2 of the signal A may be different from the potential V4 of the signal B. For example, if a gate insulating film used with the gate to which the signal B is input is thicker than a gate insulating film used with the gate to which the signal A is input, the potential amplitude of the signal B (V3-V4) can be larger than the potential amplitude of the signal A (V1-V2). In this way, influence of the signal A and that of the signal B on the on/off state of the transistor T can be substantially the same in some cases.

When both the signal A and the signal B are digital signals, the signal B may be a signal with a different digital value from that of the signal A. In that case, the signal A and the signal B can separately control the transistor T, and thus higher performance may be achieved. For example, if the transistor T is an n-channel transistor, the transistor T may be turned on only when the signal A has the potential V1 and the signal B has the potential V3, or may be turned off only when the signal A has the potential V2 and the signal B has the potential V4, in which case the transistor T, a single transistor, may function as a NAND circuit, a NOR circuit, or the like. The signal B may be a signal for controlling the threshold voltage VthA. For example, the potential of the signal B in a period when the circuit including the transistor T operates may be different from the potential of the signal B in a period when the circuit does not operate. The signal B may be a signal whose potential is different between operation modes of the circuit. In that case, sometimes the potential of the signal B is not changed as often as the potential of the signal A.

When both the signal A and the signal B are analog signals, the signal B may be an analog signal with the same potential as that of the signal A, an analog signal with a potential that is a constant multiple of the potential of the signal A, an analog signal with a potential that is higher or lower than the potential of the signal A by a constant, or the like. In that case, the on-state current of the transistor T and the operating speed of the circuit including the transistor T can be increased in some cases. The signal B may be an analog signal that is different from the signal A. In that case, the signal A and the signal B can separately control the transistor T, and thus higher performance may be achieved.

The signal A and the signal B may be a digital signal and an analog signal, respectively. Alternatively, the signal A and the signal B may be a digital signal and an analog signal, respectively.

A fixed potential Va may be applied to one gate and a fixed potential Vb may be applied to the other gate of the transistor T. When both of the gates of the transistor T are supplied with the fixed potentials, the transistor T can serve as an element equivalent to a resistor in some cases. For example, when the transistor T is an n-channel transistor, the effective resistance of the transistor can be sometimes low (high) by making the fixed potential Va or the fixed potential Vb high (low). When both the fixed potential Va and the fixed potential Vb are high (low), the effective resistance can be lower (higher) than that of a transistor with only one gate in some cases.

<Gate Insulating Layer>

The insulating layer 513 is formed using an insulating film having a single-layer structure or a stacked-layer structure. The insulating layer 513 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 513 may be a stack including any of the above materials. The insulating layer 513 may contain lanthanum (La), nitrogen, zirconium (Zr), or the like as an impurity. The insulating layer 511 can be formed in a manner similar to that of the insulating layer 513. The insulating layer 513 contains oxygen, nitrogen, silicon, hafnium, or the like, for example. Specifically, the insulating layer 513 preferably includes hafnium oxide, and silicon oxide or silicon oxynitride.

Hafnium oxide has a higher dielectric constant than silicon oxide and silicon oxynitride. Therefore, the insulating layer 513 using hafnium oxide can have larger thickness than the insulating layer 513 using silicon oxide, so that leakage current due to tunnel current can be reduced. That is, a transistor with a low off-state current can be provided. Moreover, hafnium oxide with a crystal structure has a higher dielectric constant than hafnium oxide with an amorphous structure. Therefore, it is preferable to use hafnium oxide with a crystal structure in order to provide a transistor with a low off-state current. Examples of the crystal structure include a monoclinic crystal structure and a cubic crystal structure. Note that one embodiment of the present invention is not limited to the above examples.

<Source Electrode, Drain Electrode, Backgate Electrode>

The conductive layers 541 and 542 and the conductive layer 531 can be formed in a manner similar to that of the conductive layer 530. A Cu—Mn alloy film is preferably used for the conductive layers 541 and 542 because of its low electrical resistance and because it forms manganese oxide at the interface with the oxide semiconductor layer 520 and manganese oxide can prevent Cu diffusion.

<Protective Insulating Film>

The insulating layer 514 preferably has a function of blocking oxygen, hydrogen, water, an alkali metal, an alkaline earth metal, and the like. The insulating layer 514 can prevent outward diffusion of oxygen from the oxide semiconductor layer 520 and entry of hydrogen, water, or the like into the oxide semiconductor layer 520 from the outside. The insulating layer 514 can be a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating layer 514 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor layer 520, preventing release of oxygen, which is the main component of the oxide semiconductor layer 520, from the oxide semiconductor, and preventing unnecessary release of oxygen from the insulating layer 512. In addition, oxygen contained in the aluminum oxide film can be diffused into the oxide semiconductor.

<Interlayer Insulating Film>

The insulating layer 515 is preferably formed over the insulating layer 514. The insulating layer 515 can be formed using an insulating film with a single-layer structure or a layered structure. The insulating film can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

<Film Formation Method>

A sputtering method and a plasma-enhanced chemical vapor deposition method are typical examples of a method of forming an insulating film, a conductive film, a semiconductor film, and the like. The insulating film, the conductive film, the semiconductor film, and the like may be formed by another method, for example, a thermal CVD method. A metal organic chemical vapor deposition (MOCVD) method or an atomic layer deposition (ALD) method can be employed as a thermal CVD method, for example.

A thermal CVD method has an advantage that no defect due to plasma damage is generated since it does not utilize plasma for forming a film. Deposition by a thermal CVD method may be performed in such a manner that the pressure in a chamber is set to an atmospheric pressure or a reduced pressure, and a source gas and an oxidizer are supplied to the chamber at the same time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at the same time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, so that a thin film with excellent step coverage can be formed. The thickness of the thin film can be adjusted by the number of repetition times of the sequence of the gas introduction; therefore, an ALD method makes it possible to accurately adjust thickness and thus is suitable for manufacturing a minute FET.

The conductive film and the semiconductor film that are described in the above embodiment can be formed by thermal CVD such as MOCVD or ALD. For example, in the case where an InGaZnOx (X>0) film is formed, trimethylindium, trimethylgallium, and dimethylzinc are used. Note that the chemical formula of trimethylindium is $(CH_3)_3In$. The chemical formula of trimethylgallium is $(CH_3)_3Ga$. The chemical formula of dimethylzinc is $Zn(CH_3)_2$. Without limitation to the above combination, triethylgallium (chemical formula: $(C_2H_5)_3Ga$) can be used instead of trimethylgallium and diethylzinc (chemical formula: $Zn(C_2H_5)_2$) can be used instead of dimethylzinc.

For example, in the case where a tungsten film is formed with a deposition apparatus by an ALD method, a $WF_6$ gas and a $B_2H_6$ gas are sequentially introduced plural times to form an initial tungsten film, and then a tungsten film is formed using a $WF_6$ gas and an $H_2$ gas. Note that an $SiH_4$ gas may be used instead of a $B_2H_6$ gas.

For example, in the case where an oxide semiconductor film, e.g., an InGaZnOx (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are used to form a GaO layer, and then a $Zn(CH_3)_2$ gas and an $O_3$ gas are used to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

The structure and method described in this embodiment can be combined as appropriate with any of the other structures and methods described in the other embodiments.

Embodiment 6

In this embodiment, application examples of the semiconductor device or the memory circuit described in the foregoing embodiment to an electronic component and to an electronic device including the electronic component will be described with reference to FIGS. 20A to 20F and FIGS. 23A and 23B.

Figure 23A:
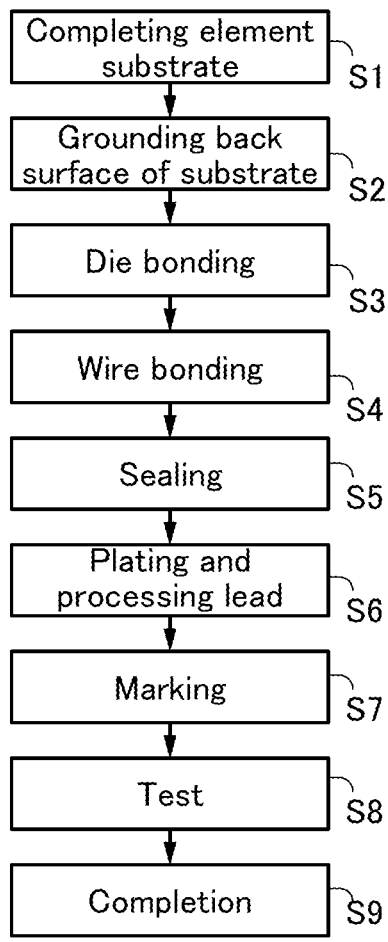
FIG. 23A is a flowchart showing a fabrication process of an electronic component.

FIG. 23A shows an example where the semiconductor device or the memory circuit described in the foregoing embodiment is used to make an electronic component. Note that an electronic component is also referred to as semiconductor package or IC package. This electronic component has a plurality of standards and names depending on a terminal extraction direction and a terminal shape. Thus, examples of the electronic component are described in this embodiment.

A circuit portion including the transistors described in the foregoing embodiment is completed by integrating detachable components on a printed circuit board through an assembly process (post-process).

The post-process can be completed through steps shown in FIG. 23A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate and dividing the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, a chip may be mounted on and bonded to an interposer.

Next, wire bonding for electrically connecting a lead of the lead frame and an electrode on a chip through a metal wire is performed (Step S4). As the metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The aforementioned electronic component includes the semiconductor device or the memory circuit described in the above embodiments. Therefore, the electronic component has reduced power consumption.

Figure 23B:
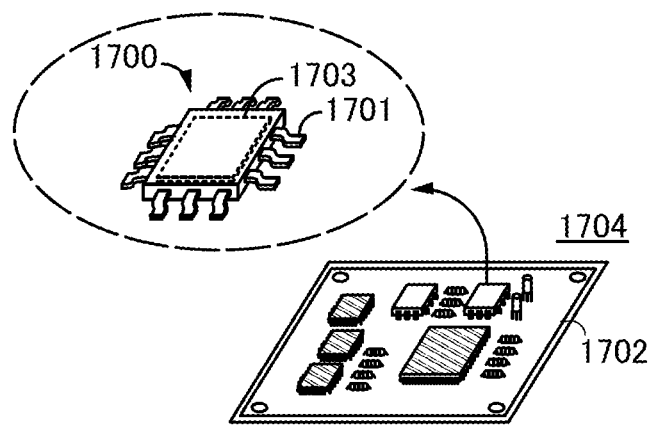
FIG. 23B is a schematic perspective view of the electronic component.

FIG. 23B is a perspective schematic diagram of a completed electronic component. FIG. 23B shows a perspective schematic diagram of a quad flat package (QFP) as an example of the electronic component. An electronic component 1700 shown in FIG. 23B includes a lead 1701 and a circuit portion 1703. The electronic component 1700 in FIG. 23B is, for example, mounted on a printed circuit board 1702. When a plurality of electronic components 1700 are used in combination and electrically connected to each other over the printed circuit board 1702, the electronic components 1700 can be mounted on an electronic device. The completed circuit board 1704 is provided in an electronic device or the like.

A semiconductor device, a memory circuit, or an electronic component of one embodiment of the present invention can be used for display devices, personal computers, or image reproducing devices provided with recording media (typically, devices that reproduce the content of recording media such as digital versatile discs (DVD) and have displays for displaying the reproduced images). Further, as electronic devices that can include the semiconductor device of one embodiment of the present invention, cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, medical devices, and the like can be given. FIGS. 20A to 20F illustrate specific examples of these electronic devices.

Figure 20A:
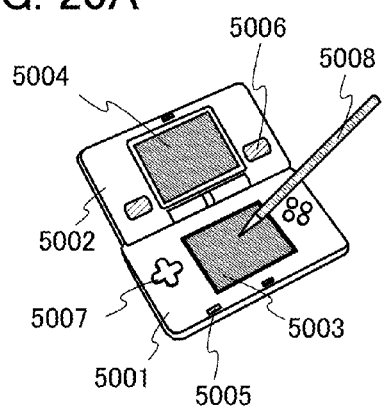
FIGS. 20A to 20F illustrate electronic devices.

FIG. 20A illustrates a portable game machine, which includes a housing 5001, a housing 5002, a display portion 5003, a display portion 5004, a microphone 5005, speakers 5006, an operation key 5007, a stylus 5008, and the like. The semiconductor device of one embodiment of the present invention can be used for a variety of integrated circuits included in the portable game machine. Although the portable game machine in FIG. 20A has the two display portions 5003 and 5004, the number of display portions in the portable game machine is not limited to two.

Figure 20B:
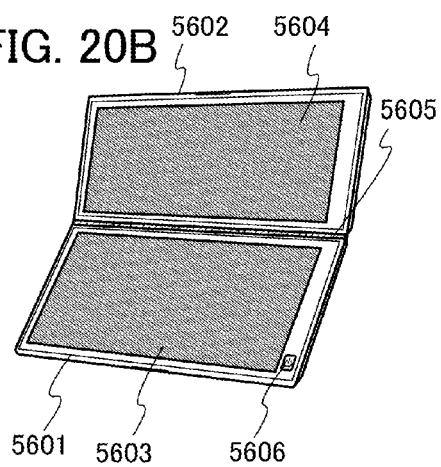

FIG. 20B illustrates a portable information terminal, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in the portable information terminal. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel portion of a display device.

Figure 20C:
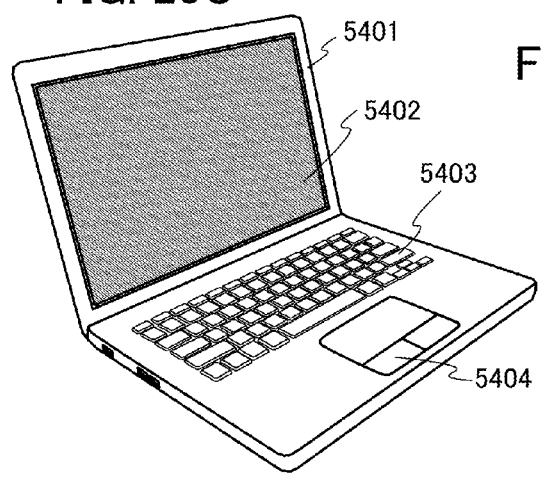

FIG. 20C illustrates a notebook personal computer, which includes a housing 5401, a display portion 5402, a keyboard 5403, a pointing device 5404, and the like. The semiconductor device of one embodiment of the present invention can be used for a variety of integrated circuits included in the notebook personal computer.

Figure 20D:
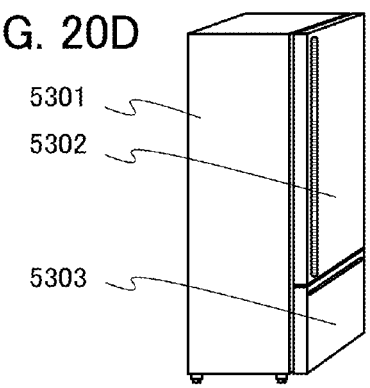

FIG. 20D illustrates an electric refrigerator-freezer, which includes a housing 5301, a door for a refrigerator 5302, a door for a freezer 5303, and the like. The semiconductor device of one embodiment of the present invention can be used for a variety of integrated circuits included in the electric refrigerator-freezer.

Figure 20E:
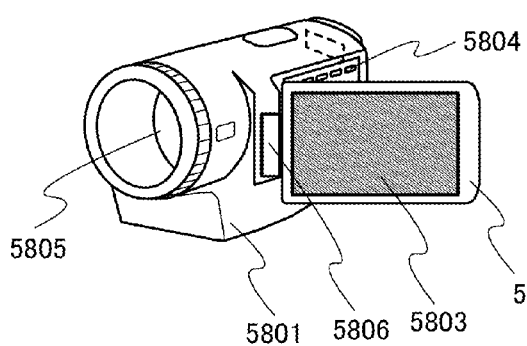

FIG. 20E illustrates a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits included in the video camera. The operation keys 5804 and the lens 5805 are provided for the first housing 5801, and the display portion 5803 is provided for the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 20F:
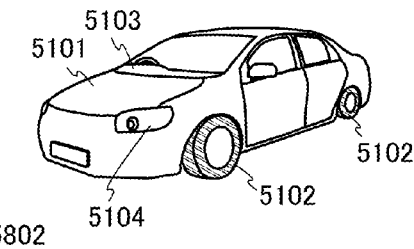

FIG. 20F illustrates a car, a vehicle, or the like which includes a car body 5101, wheels 5102, a dashboard 5103, lights 5104, and the like. The semiconductor device of one embodiment of the present invention can be used for a variety of integrated circuits included in the car, the vehicle, or the like.

The structure and method described in this embodiment can be combined as appropriate with any of the other structures and methods described in the other embodiments.

REFERENCE NUMERALS

10: semiconductor device, 13: transistor, 20: memory circuit, 30: main amplifier, 40: input/output circuit, 50: cell array, 51: memory cell, 52: transistor, 53: capacitor, 54*a*: region, 54*b*: region, 60: sense amplifier circuit, 61: sense amplifier, 62: amplifier circuit, 63: switch circuit, 64: precharge circuit, 70: driver circuit, 71: row decoder, 80: array, 101: transistor, 102: transistor, 103: transistor, 104: transistor, 105: transistor, 106: transistor, 107: transistor, 108: transistor, 109: transistor, 200: memory device, 210: driver circuit, 211: row decoder, 212: column decoder, 213: main amplifier, 214: circuit, 215: buffer, 271: conductive layer, 301: transistor, 302: transistor, 303: capacitor, 310: semiconductor substrate, 311: element separation region, 312*a*: impurity region, 312*b*: impurity region, 313*a*: conductive layer, 313*b*: conductive layer, 321: insulating film, 322*a*: conductive layer, 322*b*: conductive layer, 323: insulating film, 324: conductive layer, 325: conductive layer, 326: insulating film, 327: conductive layer, 328: conductive layer, 329: conductive layer, 330: insulating film, 341: oxide semiconductor layer, 342*a*: region, 342*b*: region, 343*a*: conductive layer, 343*b*: conductive layer, 344: insulating film, 345: conductive layer, 346: insulating film, 351: insulating film, 352: conductive layer, 353: conductive layer, 354: insulating film, 355: conductive layer, 361: conductive layer, 362: insulating film, 363: conductive layer, 364: insulating film, 371: conductive layer, 372: insulating film, 373: conductive layer, 374: insulating film, 401: opening, 402: opening, 501: transistor, 502: transistor, 503: transistor, 504: transistor, 505: transistor, 506: transistor, 510: substrate, 511: insulating layer, 512: insulating layer, 513: insulating layer, 514: insulating layer, 515: insulating layer, 520: oxide semiconductor layer, 521: oxide semiconductor layer, 522: oxide semiconductor layer, 523: oxide semiconductor layer, 530: conductive layer, 531: conductive layer, 541: conductive layer, 542: conductive layer, 551: layer, 552: layer, 560: conductive layer, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: door for refrigerator, 5303: door for freezer, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, 5806: joint, 1700: electronic component, 1701: lead, 1702: printed circuit board, 1703: circuit portion, and 1704: circuit board This application is based on Japanese Patent Application serial no. 2014-208996 filed with Japan Patent Office on Oct. 10, 2014, Japanese Patent Application serial no. 2014-227326 filed with Japan Patent Office on Nov. 7, 2014, and Japanese Patent Application serial no. 2015-148775 filed with Japan Patent Office on Jul. 28, 2015, the entire contents of which are hereby incorporated by reference.

The invention claimed is:

1. A semiconductor device comprising:
a sense amplifier circuit comprising a first sense amplifier and a second sense amplifier; and
a cell array over the sense amplifier circuit, the cell array comprising first to fourth memory cells,
wherein the first memory cell and the second memory cell are electrically connected to the first sense amplifier through a first bit line and a second bit line, respectively,
wherein the third memory cell and the fourth memory cell are electrically connected to the second sense amplifier through a third bit line and a fourth bit line, respectively,
wherein each of the first sense amplifier and the second sense amplifier is electrically connected to a first global bit line and a second global bit line, and
wherein the sense amplifier circuit is configured to select one of potentials of the first to fourth bit lines and output a selected potential to the first global bit line or the second global bit line.

2. The semiconductor device according to claim 1,
wherein the first sense amplifier comprises a first switch circuit,
wherein the second sense amplifier comprises a second switch circuit,
wherein each of the first switch circuit and the second switch circuit is electrically connected to the first global bit line and the second global bit line, and
wherein the cell array is provided over the first switch circuit, the second switch circuit, the first global bit line, and the second global bit line.

3. The semiconductor device according to claim 1,
wherein each of the first memory cell and the second memory cell comprises a transistor and a capacitor,
wherein one of a source and a drain of the transistor is electrically connected to the capacitor, and
wherein the transistor includes an oxide semiconductor in a channel formation region.

4. The semiconductor device according to claim 3,
wherein the capacitor is provided over the transistor, and
wherein the capacitor includes a region overlapping with the oxide semiconductor.

5. A circuit board comprising:
an electronic component comprising the semiconductor device according to claim 1; and
a printed circuit board.

6. An electronic device comprising:
the circuit board according to claim 5; and
at least one of a display portion, a microphone, a speaker, and an operation key.

7. An electronic device comprising:
the semiconductor device according to claim 1; and
at least one of a display portion, a microphone, a speaker, and an operation key.

8. The semiconductor device according to claim 1,
wherein each of the first sense amplifier and the second sense amplifier includes a plurality of transistors, and
wherein each of the plurality of transistors comprises silicon.

9. A semiconductor device comprising a memory circuit, the memory circuit comprising:
a sense amplifier circuit comprising a first sense amplifier and a second sense amplifier; and
a cell array over the sense amplifier circuit, the cell array comprising first to fourth memory cells,
wherein the first memory cell and the second memory cell are electrically connected to the first sense amplifier through a first bit line and a second bit line, respectively,
wherein the third memory cell and the fourth memory cell are electrically connected to the second sense amplifier through a third bit line and a fourth bit line, respectively, and
wherein each of the first sense amplifier and the second sense amplifier are electrically connected to a first global bit line and a second global bit line.

10. The semiconductor device according to claim 9,
wherein the first sense amplifier comprises a first switch circuit,
wherein the second sense amplifier comprises a second switch circuit, and
wherein each of the first switch circuit and the second switch circuit is electrically connected to the first global bit line and the second global bit line.

11. The semiconductor device according to claim 10, wherein the cell array is provided over the first switch circuit, the second switch circuit, the first global bit line, and the second global bit line.

12. The semiconductor device according to claim 9,
wherein each of the first memory cell and the second memory cell comprises a transistor and a capacitor,
wherein one of a source and a drain of the transistor is electrically connected to the capacitor, and
wherein the transistor includes an oxide semiconductor in a channel formation region.

13. The semiconductor device according to claim 12,
wherein the capacitor is provided over the transistor, and
wherein the capacitor includes a region overlapping with the oxide semiconductor.

14. A circuit board comprising:
an electronic component comprising the semiconductor device according to claim 9; and
a printed circuit board.

15. An electronic device comprising:
the semiconductor device according to claim 9; and
at least one of a display portion, a microphone, a speaker, and an operation key.

16. The semiconductor device according to claim 9,
wherein each of the first sense amplifier and the second sense amplifier includes a plurality of transistors, and
wherein each of the plurality of transistors comprises silicon.

17. A semiconductor device comprising a memory circuit, the memory circuit comprising:
a sense amplifier circuit comprising a plurality of sense amplifiers; and
a cell array over the sense amplifier circuit, the cell array comprising a plurality of memory cells,
wherein the plurality of memory cells are electrically connected to the plurality of sense amplifiers through a plurality of bit lines,
wherein the sense amplifier circuit is electrically connected to a main amplifier through a plurality of global bit lines,
wherein the number of the plurality of bit lines is larger than the number of the plurality of global bit lines, and
wherein the cell array is provided over the sense amplifier circuit, the main amplifier, and the plurality of global bit lines.

18. The semiconductor device according to claim 17,
wherein each of the plurality of sense amplifiers comprises a switch circuit electrically connected to two of the plurality of global bit lines.

19. The semiconductor device according to claim 17,
wherein the sense amplifier circuit includes a plurality of transistors, and
wherein each of the plurality of transistor comprises silicon.

20. The semiconductor device according to claim 17,
wherein each of the plurality of memory cells comprises a transistor and a capacitor,
wherein one of a source and a drain of the transistor is electrically connected to the capacitor, and
wherein the transistor includes an oxide semiconductor in a channel formation region.

21. The semiconductor device according to claim 20,
wherein the capacitor is provided over the transistor, and
wherein the capacitor includes a region overlapping with the oxide semiconductor.

22. An electronic device comprising:
the semiconductor device according to claim 17; and
at least one of a display portion, a microphone, a speaker, and an operation key.

* * * * *